(12) United States Patent
Noh et al.

(10) Patent No.: US 11,363,230 B2
(45) Date of Patent: Jun. 14, 2022

(54) IMAGE SENSOR MODULE AND IMAGE SENSOR DEVICE INCLUDING THE SAME

(71) Applicant: SAMSUNG ELECTRONICS CO., LTD., Suwon-si (KR)

(72) Inventors: Yohwan Noh, Yongin-si (KR); Chaesung Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/308,421

(22) Filed: May 5, 2021

(65) Prior Publication Data
US 2021/0266487 A1 Aug. 26, 2021

Related U.S. Application Data

(63) Continuation of application No. 16/375,961, filed on Apr. 5, 2019, now Pat. No. 11,064,148, which is a (Continued)

(30) Foreign Application Priority Data

Jul. 23, 2015 (KR) .................. 10-2015-0104489

(51) Int. Cl.
H04N 5/378 (2011.01)
H01L 27/146 (2006.01)
(Continued)

(52) U.S. Cl.
CPC ....... H04N 5/378 (2013.01); H01L 27/14621 (2013.01); H01L 27/14643 (2013.01);
(Continued)

(58) Field of Classification Search
CPC .... H04N 5/378; H04N 9/04511; H04N 9/045; H04N 5/3456; H01L 27/14643; H01L 27/14621; H01L 27/14612
See application file for complete search history.

(56) References Cited

U.S. PATENT DOCUMENTS 7,656,446 B2 2/2010 Shizukuishi
7,817,187 B2 10/2010 Silsby et al.
(Continued)

FOREIGN PATENT DOCUMENTS

JP 2010178164 8/2010
JP 2012222632 11/2012
KR 20100006033 1/2010

OTHER PUBLICATIONS

Gu et al., "Coded rolling shutter photography: Flexible space-time sampling", [online video] Computational Photography (ICCP), 2010 IEEE International Conference on IEEE, 2010 [retrieved on Jul. 15, 2016]. Retrieved from the Internet: <URL:http://www.cs.colombia. edu/CAVE/projects/crsp/crsp_video.mp4>.
(Continued)

Primary Examiner — Nhan T Tran
Assistant Examiner — Tuan H Le
(74) Attorney, Agent, or Firm — F. Chau & Associates, LLC

(57) ABSTRACT

Disclosed is an image sensor module which includes a pixel array including a plurality of sub-pixels arranged along a plurality of rows and a plurality of columns, an analog to digital converter connected to the pixel array through a plurality of data lines and converting signals output from the plurality of sub-pixels into digital signals, a row decoder connected to the pixel array through a plurality of selection lines, a plurality of transfer lines, and a plurality of reset lines, and a control logic circuit controlling the analog to digital converter and the row decoder to allow a plurality of sub-frames to be sequentially outputted from the plurality of sub-pixels, wherein each of the plurality of sub-frames is generated based on signals output from different sub-pixels among the plurality of sub-pixels.

20 Claims, 24 Drawing Sheets

Related U.S. Application Data continuation of application No. 15/175,748, filed on Jun. 7, 2016, now Pat. No. 10,271,000.

(51) Int. Cl.
*H04N 5/345* (2011.01)
*H04N 9/04* (2006.01)
*H04N 5/369* (2011.01)

(52) U.S. Cl.
CPC .......... *H04N 5/3456* (2013.01); *H04N 5/369* (2013.01); *H04N 9/045* (2013.01); *H04N 9/04511* (2018.08); *H04N 9/04557* (2018.08); *H01L 27/14612* (2013.01)

(56) References Cited

U.S. PATENT DOCUMENTS

| | | | |
|---|---|---|---|
| 7,856,178 | B2 | 12/2010 | Li et al. |
| 8,350,923 | B2 | 1/2013 | Nakayama et al. |
| 8,493,436 | B2 | 7/2013 | Lyon et al. |
| 8,803,990 | B2 | 8/2014 | Smith |
| 8,804,432 | B2 | 8/2014 | Moschiano et al. |
| 8,934,037 | B2 | 1/2015 | Suzuki |
| 8,988,504 | B2 | 3/2015 | Baer |
| 9,288,382 | B2 | 3/2016 | Fujii et al. |
| 9,538,161 | B2 * | 1/2017 | Liu ............... H04N 13/239 |
| 9,584,742 | B2 | 2/2017 | Park et al. |
| 9,888,198 | B2 * | 2/2018 | Mauritzson ....... H01L 27/14621 |
| 10,271,000 | B2 | 4/2019 | Noh et al. |
| 2003/0048366 | A1 | 3/2003 | Kondo |
| 2010/0277628 | A1 | 11/2010 | Sawada et al. |
| 2010/0282945 | A1 * | 11/2010 | Yokogawa ............. H04N 5/335 250/208.1 |
| 2011/0141331 | A1 | 6/2011 | Lee et al. |
| 2012/0044394 | A1 | 2/2012 | Komiya et al. |
| 2012/0188409 | A1 | 7/2012 | Gallagher et al. |
| 2012/0205520 | A1 | 8/2012 | Hsieh et al. |
| 2012/0256079 | A1 | 10/2012 | Liu |
| 2012/0268635 | A1 | 10/2012 | Furuta |
| 2012/0320231 | A1 | 12/2012 | Suito |
| 2013/0070121 | A1 | 3/2013 | Gu et al. |
| 2013/0201391 | A1 * | 8/2013 | Ogasahara ........... H04N 5/2258 348/374 |
| 2013/0235226 | A1 * | 9/2013 | Karn .................... H04N 5/2253 348/220.1 |
| 2013/0306841 | A1 | 11/2013 | Tate |
| 2014/0139642 | A1 | 5/2014 | Ni et al. |
| 2014/0232914 | A1 | 8/2014 | Awatani |
| 2015/0109468 | A1 | 4/2015 | Laroia |
| 2015/0237280 | A1 * | 8/2015 | Choi ................. H04N 5/23235 348/308 |
| 2015/0350583 | A1 | 12/2015 | Mauritzson et al. |
| 2015/0358593 | A1 | 12/2015 | Sato |
| 2016/0142653 | A1 | 5/2016 | Cho et al. |
| 2017/0026600 | A1 | 1/2017 | Noh et al. |
| 2019/0238775 | A1 | 8/2019 | Noh et al. |

OTHER PUBLICATIONS

Gu et al., "Coded Rolling Shutter Photography: Flexible Space-Time Sampling". Computational Photography (ICCP), 2010 IEEE International Conference on IEEE, 2010, pp. 1-8.

* cited by examiner

IMAGE SENSOR MODULE AND IMAGE SENSOR DEVICE INCLUDING THE SAME

CROSS-REFERENCE TO RELATED APPLICATIONS

This application is a continuation of U.S. patent application Ser. No. 16/375,961 filed on Apr. 5, 2019 which is a continuation of U.S. patent application Ser. No. 15/175,748, filed on Jun. 7, 2016, now U.S. Pat. No. 10,271,000 issued on Apr. 23, 2019, which claims priority under 35 U.S.C. § 119 to Korean Patent Application No. 10-2015-0104489 filed on Jul. 23, 2015, in the Korean Intellectual Property Office, the entire contents which are hereby incorporated by reference.

BACKGROUND

Embodiments of the inventive concept relate to an image sensor, and more particular, to an image sensor module and an image device including the same.

An image sensor performs an operation converting light from the outside into an electrical signal. Image sensors are classified into a complementary metal oxide semiconductor (CMOS) image sensor and a charge coupled device (CCD) image sensor. Since the CMOS image sensor is manufactured using general-purpose semiconductor manufacturing equipment, the CMOS image sensor is relatively cheap compared to the CCD image sensor. The quality of image obtained by the CCD image sensor is higher that obtained by the CMOS image sensor.

An image sensor module may include at least one image sensor which includes a plurality of pixels. The plurality of pixels are arranged in a matrix of rows and columns. An image frame is generated by combining pieces of data which are generated by each pixel of the image sensor module. Since the image sensor module includes hundreds of thousands or tens of millions of pixels, various sensing manners for receiving data from the pixels efficiently and generating an image frame based on the received data are being developed. Such sensing manners include a global shutter manner in which all pixels are sensed at the same time, a flutter shutter manner in which all pixels are sensed at the same time and an exposure time is adjusted, a rolling shutter manner or a coded rolling manner in which pixels are controlled by the row, and the like.

With the advancement of technologies, the resolution of the image sensor module has been increased. In this case, a sensing time about a high-resolution image sensor increase may cause delay of signal processing and noise. Therefore, there is required a new sensing technique to obtain an image or picture signal with increased quality.

SUMMARY

Embodiments of the inventive concept are directed to provide an image sensor module, which is capable of dividing a plurality of sub-pixels in a pixel array by a pixel unit and reading a plurality of sub-frames based on the pixel unit, and an image sensor device including the same, thereby increasing performance thereof.

One aspect of embodiments of the inventive concept is directed to provide an image sensor module including a pixel array including a plurality of sub-pixels arranged along a plurality of rows and a plurality of columns an analog to digital converter connected to the pixel array through a plurality of data lines and converting signals output from the plurality of sub-pixels into digital signals, a row decoder connected to the pixel array through a plurality of selection lines, a plurality of transfer lines, and a plurality of reset lines, and a control logic circuit configured to control the analog to digital converter and the row decoder to allow a plurality of sub-frames to be sequentially outputted from the plurality of sub-pixels. Each of the plurality of sub-frames is generated based on signals output from different sub-pixels among the plurality of sub-pixels.

In example embodiments, a first sub-pixel among the plurality of sub-pixels comprises a first color filter configured to pass light having a predetermined color, a first photodiode configured to generate charges in response to the light passing through the first color filter, a first transfer transistor configured to be placed between one end of the first photodiode and a first node and operate in response to a signal on a first transfer line among the plurality of transfer lines, a first reset transistor configured to be placed between a power supply voltage and the first node and operate in response to a first reset line among the plurality of reset lines, a first selection transistor configured to be placed between the power supply voltage and a second node and operate in response to a voltage on the first node, and a first access transistor configured to be placed between the second node and a first data line among the plurality of data lines and operate in response to a signal on a first selection line among the plurality of selection lines.

In example embodiments, a second sub-pixel, placed at the same row as the first sub-pixel, among the plurality of sub-pixels comprises, a second color filter configured to pass light having a predetermined color, a second photodiode configured to generate charges in response to the light passing through the second color filter, a second transfer transistor configured to be placed between one end of the second photodiode and a third node and operate in response to a signal on a second transfer line among the plurality of transfer lines, a second reset transistor configured to be placed between the power supply voltage and the third node and operate in response to the first reset line, a second selection transistor configured to be placed between the power supply voltage and a fourth node and operate in response to a voltage on the third node, and a second access transistor configured to be placed between the fourth node and a second data line among the plurality of data lines and operate in response to a signal on the first selection line.

One aspect of embodiments of the inventive concept is directed to provide an image sensor device including a first image sensor module generating a first frame in a first read manner, and a second image sensor module generating a plurality of sub-frames corresponding to the first frame in a second read manner while the first frame of the first image sensor module is generated.

In example embodiments, the second image sensor module comprises a pixel array including a plurality of sub-pixels, and wherein the plurality of sub-pixels of the pixel array is arrayed based on a color filter array of a 4PD-Bayer pattern.

In example embodiments, a first sub-frame among the plurality of sub-frames is generated based on signals output from sub-pixels, placed on a first sub-array, from among the plurality of pixels. A second sub-frame among the plurality of sub-frames is generated based on signals output from sub-pixels, placed on a second sub-array different from the first sub-array, from among the plurality of pixels. A third sub-frame among the plurality of sub-frames is generated based on signals output from sub-pixels, placed on a third sub-array different from the first and second sub-arrays, from among the plurality of pixels. A fourth third sub-frame among the plurality of sub-frames is generated based on signals output from sub-pixels, placed on a fourth sub-array different from the first, second, and third sub-arrays, from among the plurality of pixels.

One aspect of embodiments of the inventive concept is directed to provide an image sensor module comprising a pixel array including a plurality of sub-pixels arranged along a plurality of rows and a plurality of columns, an analog to digital converter connected to the pixel array through a plurality of data lines and converting signals output from the plurality of sub-pixels into digital signals, a row decoder connected to the pixel array through a plurality of selection lines, a plurality of transfer lines, and a plurality of reset lines, and a control logic circuit configured to control the analog to digital converter and the row decoder to allow a first sub-frame to be outputted from sub-pixels, placed on odd-numbered rows and odd-numbered columns, from among the plurality of sub-pixels, a second sub-frame to be outputted from sub-pixels, placed on the odd-numbered rows and even-numbered columns, from among the plurality of sub-pixels, a third sub-frame to be outputted from sub-pixels, placed on even-numbered rows and the odd-numbered columns, from among the plurality of sub-pixels, and a fourth sub-frame to be outputted from sub-pixels, placed on the even-numbered rows and the even-numbered columns, from among the plurality of sub-pixels.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the inventive concept will be described with respect to accompanying drawings. In the following description, detailed information such as detailed components and structures may be provided to help understanding of embodiments of the inventive concept. Modifications and changes about embodiments of the inventive concept will be variously made without departing from the scope and spirit of the inventive concept. Terms used or disclosed herein may be terms which are defined or selected in the light of a technical feature of the inventive concept, not limited to a specific function. The terms disclosed herein may be defined based on information disclosed in the detailed description or drawings.

Function blocks, units, or modules disclosed in the detailed description or illustrated in drawings may be connected directly or indirectly with any other components as well as components illustrated in drawings or disclosed in the detailed description. A connection between function blocks, units, or modules run be a connection by each communication or a physical connection.

Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal sense unless expressly so defined herein in various embodiments of the present disclosure.

Figure 1:
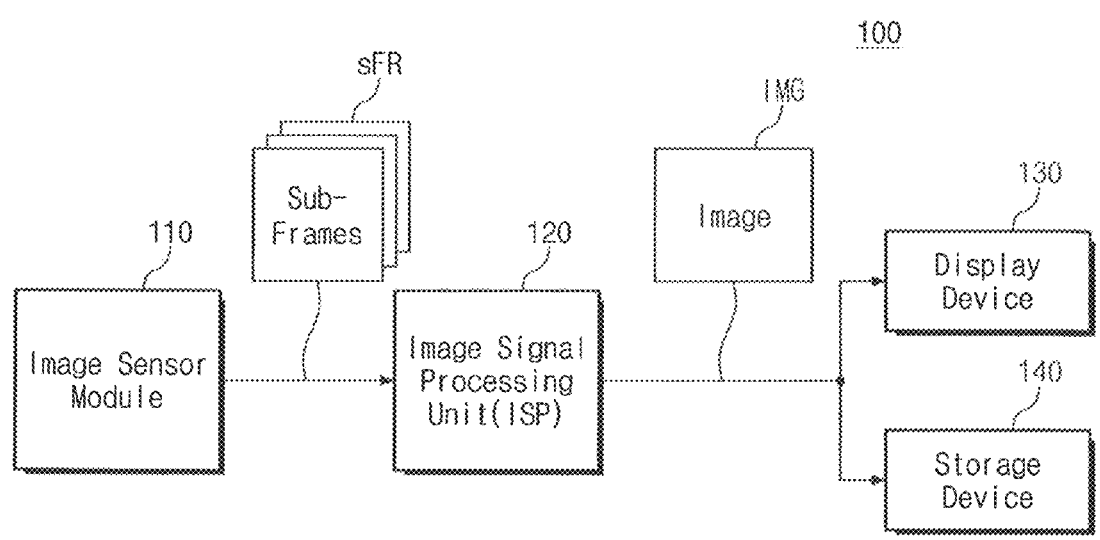
FIG. 1 is a block diagram schematically illustrating a user system according to an example embodiment of the inventive concept.

FIG. 1 is a block diagram schematically illustrating a user system according to an example embodiment of the inventive concept. Referring to FIG. 1, a user system 100 may include an image sensor module 110, an image signal processing unit (ISP) 120, a display device 130, and a storage device 140.

In example embodiments, the user system 100 may include one of electronic devices such as a computer, a portable computer, a ultra-mobile PC (UMPC), a workstation, a server computer, a net-book, a PDA, a portable computer, a web tablet, a wireless phone, a mobile phone, a smart phone, a digital camera, a digital audio recorder, a digital picture player, a device capable of transmitting and receiving information in a wireless environment, or one of electronic devices capable of obtaining external images such as electronic devices constituting a home network.

The image sensor module 110 may convert an image of an external object into an electrical signal or a data signal. For example, the image sensor module 110 may include a plurality of pixels. Each of the pixels may receive light reflected from the external object and may convert the received light into an electrical image signal or a photo signal. The image sensor module 110 may output frame data or sub-frame data sFR based on the converted signals. In example embodiments, the frame data may be data which is generated based on signals sensed from all pixels included in the image sensor module, and the sub-frame data may be data which is generated based on signals sensed from a part of the plurality of pixels. In example embodiments, the resolution of the sub-frame data may be lower than that of the frame data.

The image signal processing unit 120 may process frame data (i.e., image data or photo data) or sub-frame data received from the image sensor module 110 and may output corrected image data IMG. For example, the image signal processing unit 120 may generate the image data IMG by performing the following processing with respect to the received frame data: color interpolation, color correction, gamma correction, color space conversion, edge correction, etc.

The display device 130 may output the image data IMG from the image signal processing unit 120 to allow a user to check the image data IMG. The display device 130 may include, for example, at least one of various display panels such as a liquid crystal display panel, an organic light emitting display panel, an electrophoretic display panel, and an electro wetting display panel. The display device 130 may output the image data IMG through a display panel.

The storage device 140 may store the image data IMG from the image signal processing unit 120. The storage device 140 may include a volatile memory device such as a static random access memory (SRAM), a dynamic RAM (DRAM), or a synchronous DRAM (SDRAM) or a nonvolatile memory device such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

For descriptive convenience, below, it is assumed that the image sensor module 110 generates a frame FR or a sub-frame sFR. In this case, the frame FR or the sub-frame sFR may indicate data which is captured by pixels or sub-pixels included in the image sensor module 110.

The image sensor module 110 according to an example embodiment of the inventive concept may generate a plurality of sub-frames sFRs. The plurality of sub-frames sFRs may indicate data which is captured by a part of the plurality of pixels included in the image sensor module 110. In example embodiments, each of a plurality of sub-frames sFRs may be data which is captured by a part of the plurality of pixels based on a predefined order.

As will be later, the image sensor module 110 may include a plurality of pixels arranged in a row direction and a column direction. In this case, a first sub-frame may be data which is captured by odd-numbered rows and odd-numbered columns, a second sub-frame may be data which is captured by the odd-numbered rows and even-numbered columns, a third sub-frame may be data which is captured by even-numbered rows and the odd-numbered columns, and a fourth sub-frame may be data which is captured by the even-numbered rows and the even-numbered columns. That is, the image sensor module 110 may generate a sub-frame sFR based on a part of a plurality of pixels.

In example embodiments, a vertical synchronization time taken to sense (or read out) each of the plurality of sub-frames sFRs may be reduced because each of a plurality of sub-frames sFRs is captured by a part of a plurality of pixels. That is, the performance of the image sensor module 110 associated with image capturing may be increased.

Furthermore, a time taken to read out a plurality of sub-frames sFRs may be the same as a time taken to read out a full frame FR being data captured by all pixels, and each of the sub-frames sFRs may be data in which the full frame FR is sampled. For this reason, the image signal processing unit 120 may generate a high-speed image based on the plurality of sub-frames sFRs.

According to embodiments of the present inventive concepts, the user system 100 may support a high dynamic range (HDR) or a world dynamic range (WDR) by adjusting an exposure time of each of the plurality of sub-frames sFRs.

Below, a structure of the image sensor module 110 and the plurality of sub-frames sFRs will be described with reference to accompanying drawings.

Figure 2:
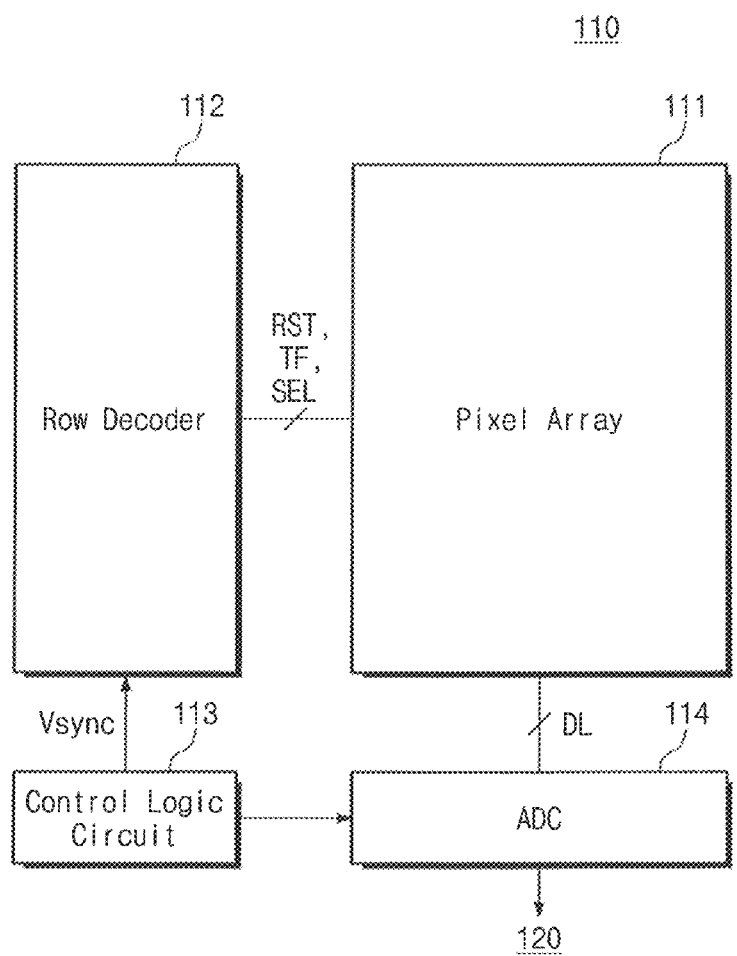
FIG. 2 is a block diagram schematically illustrating an image sensor module of FIG. 1.

FIG. 2 is a block diagram schematically illustrating an image sensor module of FIG. 1. Referring to FIGS. 1 and 2, the image sensor module 110 may include a pixel array 111, a row decoder 112, a control logic circuit 113, and an analog to digital convener (ADC) 114.

The pixel array 111 may include a plurality of pixels. Each of the plurality of pixels may include a plurality of sub-pixels. The plurality of sub-pixels may be arranged in the row direction and the column direction. Sub-pixels in the same column may be connected to the same data fine DL. Sub-pixels in the same row may be connected to the same reset line RST and the same selection line SEL. Sub-pixels in the same row may be connected to at least two transfer line TF. For example, a part of sub-pixels in the same row may be connected to a first transfer line, and the other thereof may be connected to a second transfer line. The pixel array 111 will be described in detail with reference to FIGS. 3 and 4.

The row decoder 112 may be connected to the pixel array 111 through the reset lines RST, the transfer lines TF, and the selection lines SEL. The row decoder 112 may drive the reset lines RST, the transfer lines TF, and the selection lines SEL in response to a control of the control logic circuit 113. For example, the row decoder 112 may decode a row address received from the control logic circuit 113 and may drive the reset lines RST, the transfer lines TF, and the selection lines SEL based on the decoded result.

The control logic circuit 113 may control the row decoder 112 and the ADC 114. The control logic circuit 113 may control the row decoder 112 and the ADC 114 such that a sub-frame sFR is captured by a plurality of pixels or a plurality of sub-pixels included in the pixel array 111. The control logic circuit 113 may activate a vertical synchronization signal Vsync and may transfer the activated vertical synchronization signal Vsync to the row decoder 112. During the activation of the vertical synchronization signal Vsync, the control logic circuit 113 may provide the row decoder 112 with a row address for controlling a plurality of pixels or a plurality of sub-pixels.

The ADC 114 may be connected to the pixel array 111 through data lines DL. The ADC 114 may convert electrical signals, received from a plurality of sub pixels included in the pixel array 111, into digital signals and may provide the digital signals to the image signal processing unit 120. In example embodiments, a digital signal may be a data signal indicting a sub-frame sFR.

Figure 3:
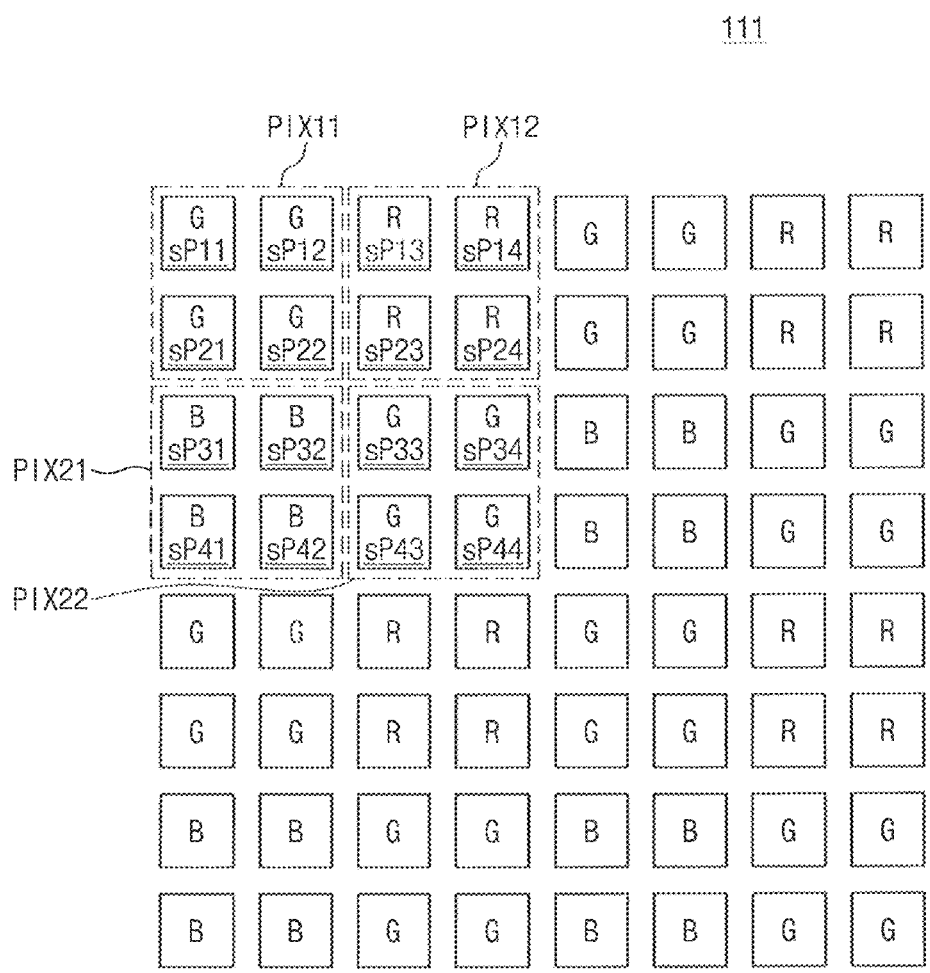
FIG. 3 is a block diagram schematically illustrating a pixel array of FIG. 2.

FIG. 3 is a block diagram schematically illustrating a pixel array of FIG. 2. In example embodiments, The pixel array illustrated in FIG. 3 may include a color filter array of the pixel array.

For descriptive convenience, below, it is assumed that a pixel array has an 8-by-8 structure. Furthermore, it is assumed that one pixel PIX includes four (4) sub-pixels sP adjacently arranged. However, the scope and spirit of the inventive concept may not be limited thereto, but the arrangement of the pixel array 111 and a color filter array (CFA) may be variously changed or modified without departing from the scope and spirit of the inventive concept.

Referring to FIGS. 2 and 3, the pixel array 111 may include a plurality of pixels PIX11 to PIX22. As illustrated in FIG. 3, each of the plurality of pixels PIX11 to PIX22 may include a plurality of sub-pixels.

For example, the pixel PIX11 may include sub-pixels sP11, sP12, sP21, and sP22. Each of the sub-pixels sP11, sP12, sP21, and sP22 may include a green (G) color filter. That is, the sub-pixels sP11, sP12, sP21, and sP22 may convert green light into an electrical signal.

The pixel PIX12 may include sub-pixels sP13, sP14, sP23, and sP24. Each of the sub-pixels sP13, sP14, sP23, and sP24 may include a red (R) color filter. That is, the sub-pixels sP13, sP14, sP23, and sP24 may convert red light into an electrical signal.

The pixel PIX21 may include sub-pixels sP31, sP32, sP41, and sP42. Each of the sub-pixels sP31, sP32, sP41, and sP42 may include a blue (B) color filter. That is, the sub-pixels sP31, sP32, sP41, and sP42 may convert rod light into an electrical signal.

The pixel PIX22 may include sub-pixels sP33, sP34, sP43, and sP44. Each of the sub-pixels sP33, sP34, sP43, and sP44 may include a green (G) color filter. That is, the sub-pixels sP33, sP34, sP43, and sP44 may convert green light into an electrical signal.

Likewise, as illustrated in FIG. 3, one pixel PIX may include four sub-pixels which are adjacently arranged, and four sub-pixels included in one pixel may include the color filter.

In example embodiments, the four pixels PIX11, PIX12, PIX21, and PIX22 may constitute a Bayer pattern. Likewise, as illustrated in FIG. 3, a plurality of pixels each of which includes four sub-pixels adjacently arranged may constitute the Bayer pattern. For descriptive convenience, the above-described color filter array (i.e., a color filter array in which four pixels PIX11, PIX12, PIX21, and PIX22 or 16 sub-pixels constitute one Bayer pattern) may be referred to as "color filter array of a 4PD-Bayer pattern".

In example embodiments, the Bayer pattern is described with reference to FIG. 3. However, the scope and spirit of the inventive concept may not be limited thereto. For example, the pixel array 111 may include various color filter array patterns such as an RGBE pattern, a CYGM pattern, a CYYM pattern, and the like.

Figure 4:
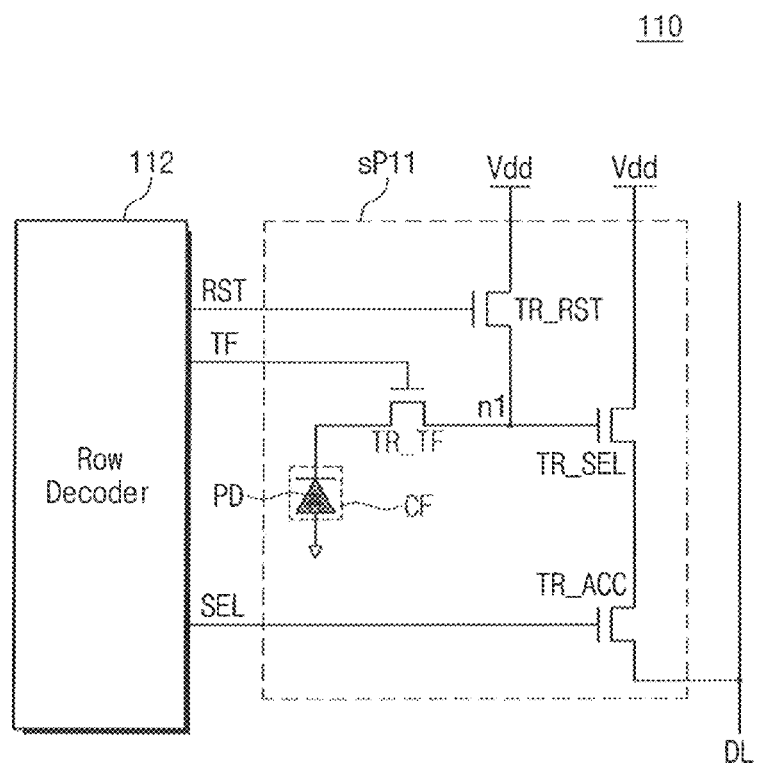
FIG. 4 is a diagram for describing one sub-pixel illustrated in FIG. 3.

FIG. 4 is a diagram for describing one sub-pixel illustrated in FIG. 3. For ease of illustration, components which are not needed to describe a configuration and an operation of the sub-pixel sP11 may be omitted. An embodiment of the inventive concept is exemplified in FIG. 4 as a sub-pixel has a 4TR structure. However, the scope and spirit of the inventive concept may not be limited thereto. A sub-pixel array may be changed or modified to have a 1TR structure, a 3TR structure, or any other pixel structure.

Referring to FIGS. 3 and 4, the sub-pixel sP11 may be connected to the row decoder 112 through a reset line RST, a transfer line TF, and a selection line SEL. The sub-pixel sP11 may include a photodiode PD, a transfer transistor TR_TF, a reset transistor TR_RST, a selection transistor TR_SEL, and an access transistor TR_ACC.

One end of the transfer transistor TR_TF may be connected to a cathode of the photodiode PD, the other end thereof may be connected to a first node n1, and a control electrode thereof may be connected to the transfer line TF. One end of the reset transistor TR_RST may be connected to receive a power supply voltage Vdd, the other end thereof may be connected to the first node n1, and a control electrode thereof may be connected to the reset line RST. One end of the selection transistor TR_SEL may be connected to receive the power supply voltage Vdd, the other end thereof may be connected to one end of the access transistor TR_ACC, and a control electrode thereof may be connected to the first node n1. The other end of the access transistor TR_ACC may be connected to a data line DL, and a control electrode thereof may be connected to the selection line SEL.

The photodiode PD may generate charges in response to light passing through a color filter CF. The color filter CF may be configured such that light of a predetermined color is transmitted. In example embodiments, as described with reference to FIG. 3, the color filter CF of the sub-pixel sP11 may be a green (G) color filter. In this case, light which passes through the color filter CF may be green light, and the photodiode PD may generate charges in response to the green light.

The transfer transistor TR_TF may provide the first node n1 with charges, which are generated by the photodiode PD, in response to a control signal on the transfer line TF.

The reset transistor TR_RST may reset a potential of the node n1 to the power supply voltage Vdd in response to a signal on the reset line RST.

The selection transistor TR_SEL may provide the power supply voltage Vdd to a drain of the access transistor TR_ACC in response to a voltage on the first node n1. As the selection transistor TR_SEL operates, a drain voltage of the access transistor TR_ACC may vary in proportion to a voltage on the first node n1. That is, a variation in a drain voltage of the access transistor TR_ACC may correspond to a variation in the amount of charges generated by the photodiode PD. In other words, the variation in the drain voltage may be a value corresponding to data captured by the photodiode PD.

The access transistor TR_ACC may provide the data line DL with data (i.e., a changed voltage) in response to a signal on the selection line SEL.

Figure 5:
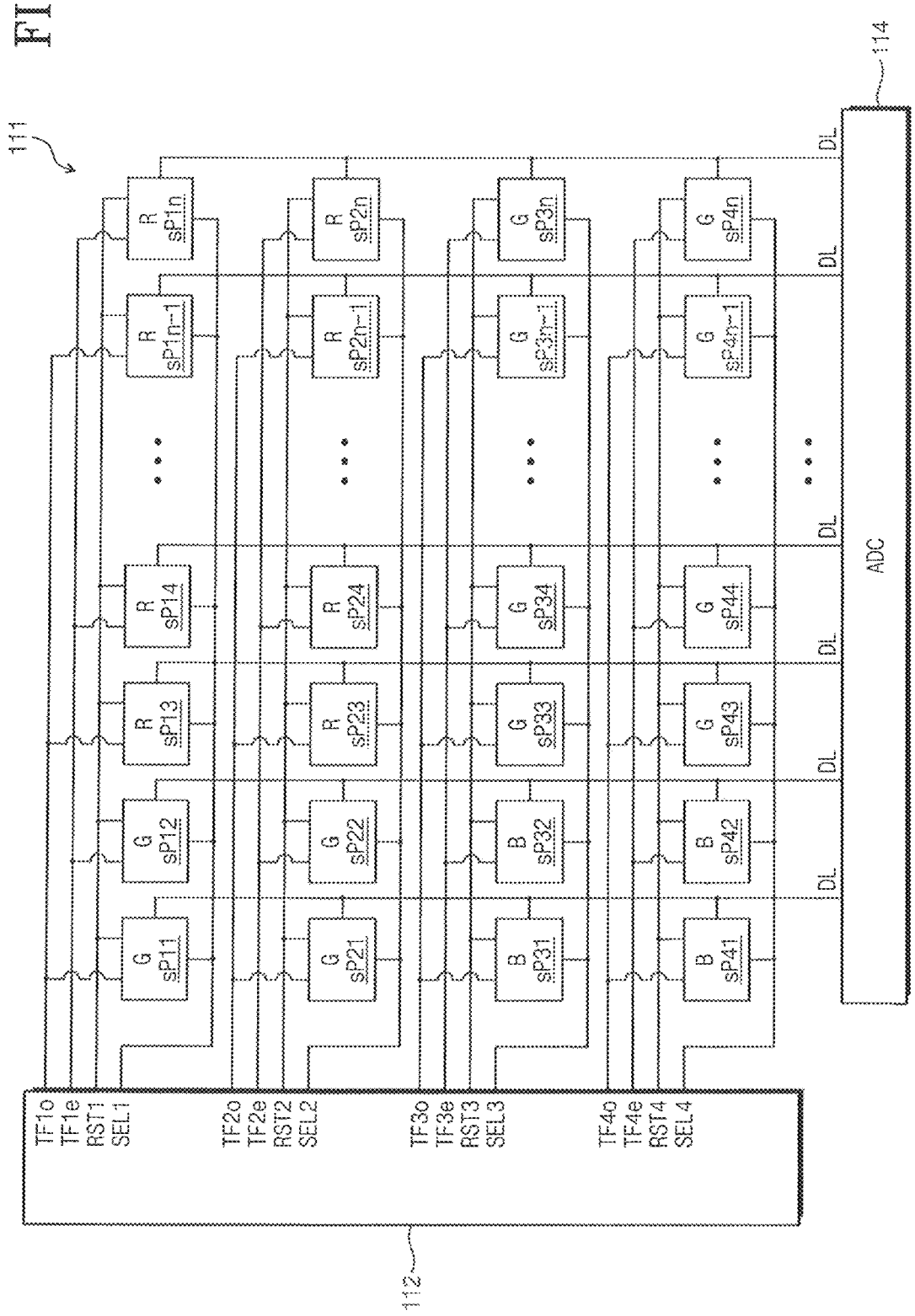
FIG. 5 is a block diagram schematically illustrating a pixel array of an image sensor module illustrated in FIG. 2.

FIG. 5 is a block diagram schematically illustrating a pixel array of an image sensor module illustrated in FIG. 2. For ease of illustration, a part of a plurality of sub-pixels included in a pixel array is illustrated in FIG. 5.

Referring to FIGS. 3 and 5, the image sensor module 110 may include the pixel array 111, the row decoder 112, and the ADC 114.

The pixel array 111 may include a plurality of sub-pixels sP11 to sP4$n$, which are arrayed along the row direction and the column direction. As described with reference to FIG. 3, one pixel (e.g., PIX11) may include four adjacent sub-pixels (e.g., sP11, sP12, sP21, and sP22), which have the same color filter (e.g., a green color filter). A color filter array of the pixel array is described with reference to FIG. 3, and a description thereof is thus omitted.

In example embodiments, each of sub-pixels in the same row may be connected to the same reset line RST and the same selection line SEL. For example, the sub-pixels sP11 to sP1$n$ in a first row may be connected to a first reset line RST11 and a first selection line SEL1, respectively.

In example embodiments, sub-pixels in the same row may be connected to at least two transfer lines TF. For example, sub-pixels (e.g., sP11, sP13, . . . , sP1$n$-1), placed at odd-numbered columns, from among sub-pixels sP11 to sP1$n$ in the first row may be connected to a first odd-numbered transfer line TF1$o$, and sub-pixels (e.g., sP12, sP14, . . . , sP1$n$), placed at even-numbered columns, from among the sub-pixels sP11 to sP1$n$ in in the first row may be connected to a first even-numbered transfer line TF1$e$.

Sub-pixels in second to fourth rows may be connected to second to fourth reset lines RST2 to RST4 second to fourth selection lines SEL2 to SEL4, second to fourth odd-numbered transfer lines TR2o to TR4o, and second to fourth even-numbered transfer lines TF2e to TF4e in a manner similar to the sub-pixels in the first row.

In example embodiments, sub-pixels in the same row may be connected with different transfer lines, thereby making it possible to control sub-pixels, connected with different transfer lines, independently of each other. For example, under a control of the control logic circuit 113, data may be read out from the sub-pixels sP11, sP13, . . . , and sP1n-1 at the first row and odd-numbered column. The read data may be a part of a sub-frame (e.g., a first sub-frame) described with reference to FIG. 1.

Likewise, under a control of the control logic circuit 113, data (i.e., a part of a sub-frame sFR) may be read out from the sub-pixels sP12, sP14, . . . , and sP1n at the first row and even-numbered column. The read data may be a part of a sub-frame (e.g., a second sub-frame different from the first sub-frame) described with reference to FIG. 1.

In example embodiments, a time which is taken to read out data captured by a part of sub-pixels in the same row relay be shorter than a time which is taken to read out data captured by all sub-pixels in the same row. The image sensor module 110 according to an example embodiment of the inventive concept may read out a plurality of sub-frames during a time when one full frame is read out, thereby making it possible to generate a high-speed image.

As described above, in the image sensor module 110 according to an example embodiment of the inventive concept, four sub-pixels adjacently arranged may include the same color filter, and sub-pixels in the same row may be connected to at least two transfer lines, respectively. The image sensor module 110 may read out data (i.e., a part of a sub-frame) from a part of sub-pixels in the same row.

A sub-frame read method of the image sensor module 110 will be described in detail with reference to accompanying drawings.

FIGS. 6 to 9 are diagrams for describing a sub-frame illustrated in FIG. 1. For descriptive convenience, a sub-frame according to an example embodiment of the inventive concept will be described with reference to a color filter array (CFA) described with reference to FIG. 3. Furthermore, as described above, it is assumed that the pixel array 111 includes 8-by-8 sub-pixels sPs. In addition, it is assumed that sub-pixels sPs are arrayed along the row direction and the column direction. However, the scope and spirit of the inventive concept may not be limited thereto.

Below, it is assumed that each of first to eighth rows R1 to R8 is determined according to arrangement of sub-pixels included in the pixel array 111, and it is assumed that each of first to eighth columns C1 to C8 is determined according to arrangement of sub-pixels included in the pixel array 111.

For descriptive convenience, the term "an odd-numbered sub-set in a first row" may mean sub-pixels which are placed at odd-numbered columns, from among sub-pixels placed at the first row R1. Likewise, the term "an even-numbered sub-set in a first row" may mean sub-pixels which are placed at even-numbered columns, from among sub-pixels placed at the first row R1 and which are denoted by "R1_Ce".

For descriptive convenience, the term "sub-pixels in a specific row" may be used to indicate sub-pixels placed at the specific row, the term "sub-pixels in a specific column" may be used to indicate sub-pixels placed at the specific column, and the term "a sub-pixel at the specific row and specific column" may be used to indicate a sub-pixel placed at an intersection of the specific row and the specific column.

It is assumed that the image sensor module 110 generates first to fourth sub-frames sFR1 to sFR4 with respect to one frame FR (i.e., a full frame). However, the scope and spirit of the inventive concept may not be limited thereto. For example, the number of sub-pixels about one full frame may increase or decrease according to arrangement of sub-frames or pixels or a structure of a column filter array.

The above-described reference numerals and description are example, not limited thereto.

Figure 6:
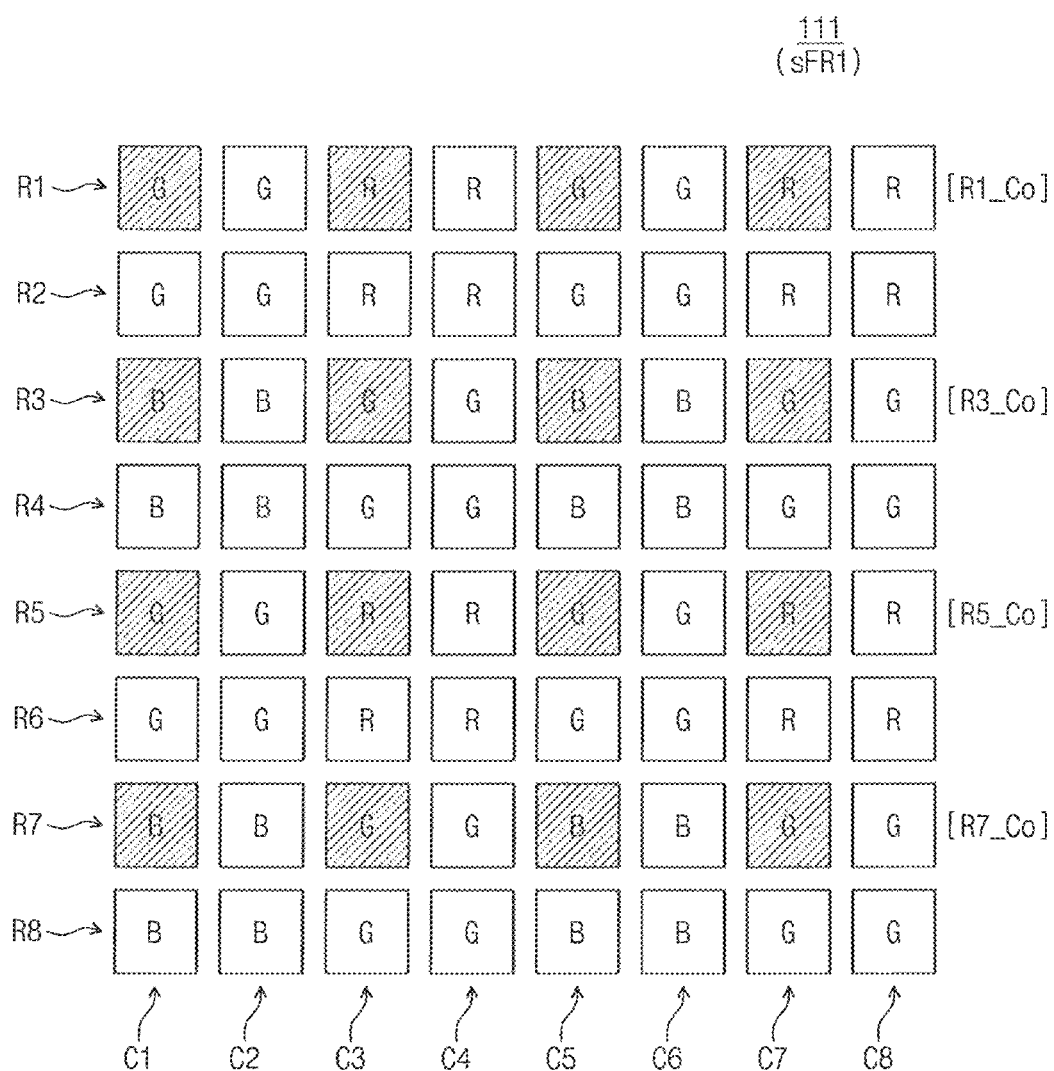
FIGS. 6 to 9 are diagrams for describing a sub-frame illustrated in FIG. 1.

Referring to FIGS. 2 and 6, the pixel array 111 may include a plurality of sub-pixels. As described with reference to FIG. 3, each of the plurality of sub-pixels may include a green (G) color filter, a red (R) color filter, or a blue (B) color filter. Arrangement of the plurality of sub-pixels and a color filter are described with reference to FIG. 3, and a description thereof is thus omitted.

A plurality of sub-pixels ma be arranged along the first to eighth rows R1 to R8 and the first to eighth columns C1 to C8. In this case, sub-pixels, belonging to odd-numbered columns (e.g., C1, C3, C5, and C7), from among sub-pixels at the first row R1 may be an odd-numbered sub-set R1_Co of the first row. Sub-pixels, belonging to odd-numbered columns (e.g., C1, C3, C5, and C7), from among sub-pixels at the third row R3 may be an odd-numbered sub-set R3_Co of the third row. Sub-pixels, belonging to odd-numbered columns (e.g., C1, C3, C5, and C7), from among sub-pixels at the fifth row R5 may be an odd-numbered sub-set. R5_Co of the fifth row. Sub-pixels, belonging to odd-numbered columns (e.g., C1, C3, C5, and C7), from among sub-pixels at the seventh row R7 may be an odd-numbered sub-set R7_Co of the seventh row.

A first sub-frame sFR1 may be generated based on data captured by sub-pixels of the odd-numbered sub-sets R1_Co, R3_Co, R5_Co, and R7_Co of the first, third, fifth, and seventh rows. That is, the first sub-frame sFR1 may be generated based on data captured by a part (in detail, sub-pixels at the odd-numbered rows and odd-numbered columns) of a plurality of sub-pixels included in the pixel array 111.

The control logic circuit 113 may control the row decoder 112 and the ADC 114 such that data captured by the odd-numbered sub-sets R1_Co, R3_Co, R5_Co, and R7_Co of the first, third, fifth, and seventh rows is outputted. For example, to output data captured by the odd-numbered sub-sets R1_Co, R3_Co, R5_Co, and R7_Co of the first, third, fifth, and seventh rows, the control logic circuit 113 may provide addresses of the first, third, fifth, and seventh rows R1, R3, R5, and R7 to the row decoder 112 and addresses of the first, third, fifth, and seventh columns to the ADC 114.

The first sub-frame sFR1 which is generated based on the odd-numbered sub-sets R1_Co, R3_Co, R5_Co, and R7_Co of the first, third, fifth, and seventh rows may have the Bayer pattern. For example, a sub-pixel at the first row R1 and first column C1 may include a green color filter, a sub-pixel at the first row R1 and third column C3 may include a red color filter, a sub-pixel at the third row R3 and first column C1 may include a blue color filter, and a sub-pixel at the third row R3 and third column C3 may include a green color filler. That is, four sub-pixels, adjacent to each other, from among sub-pixels of the odd-numbered sub-sets R1_Co, R3_Co, R5_Co, and R7_Co of the first, third, fifth, and seventh rows may have the Bayer pattern. Thus, signal processing about the first sub-frame sFR1 may be possible without changing a structure or a function of the image signal processing unit 120 (refer to FIG. 1).

Data captured by a part of sub-pixels in one row may be outputted, and thus, a read speed may be increased compared to that in reading a full frame.

Figure 7:
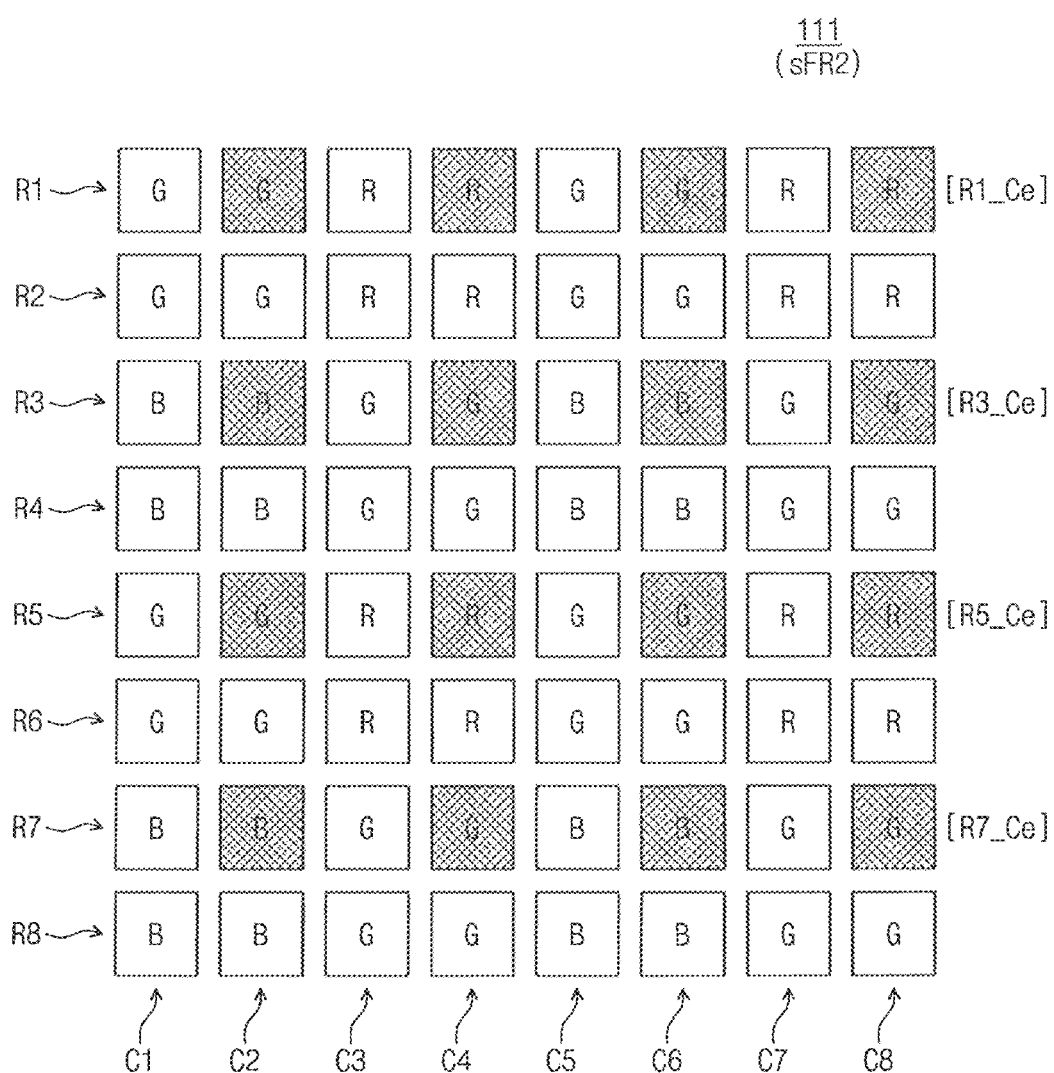

Referring to FIGS. 2 and 7, the pixel array 111 may include a plurality of sub-pixels. The plurality of sub-pixels may be arranged along the first to eighth rows R1 to R8 and the first to eighth columns C1 to C8, and each of the plurality of sub-pixels may include a green color filter, a red color filter, or a blue color filter.

Sub-pixels, belonging to even-numbered columns (e.g., C2, C4, C6, and C8), from among sub-pixels at the first row R1 may be an even-numbered sub-set R1_Ce of the first row. Sub-pixels, belonging to even-numbered columns (e.g., C2, C4, C6, and C8), from among sub-pixels at the third row R3 may be an even-numbered sub-set R3_Ce of the third row. Sub-pixels, belonging to even-numbered columns (e.g., C2, C4, C6, and C8), from among sub-pixels at the fifth row R5 may be an even-numbered sub-set R5_Ce of the fifth row. Sub-pixels, belonging to even-numbered columns (e.g., C2, C4, C6, and C8), from among sub-pixels at the seventh row R7 may be an even-numbered sub-set R7_Ce of the seventh row.

The even-numbered sub-sets R1_Ce, R3_Ce, R5_Ce, and R7_Ce of the first, third, fifth, and seventh rows may constitute a second sub-frame sFR2. For example, the second sub-frame sFR2 may be generated based on data captured by sub-pixels of the even-numbered sub-sets R1_Ce, R3_Ce, R5_Ce, and R7_Ce of the first third, fifth, and seventh rows.

The first sub-frame sFR1 described with reference to FIG. 6 may be generated based on data captured by the odd-numbered sub-set R1_Co of the first row and the second sub-frame sFR2 described with reference to FIG. 7 may be generated based on data captured by the even-numbered sub-set R1_Ce of the first row. In this case, sub-pixels of the odd-numbered sub-set R1_Co of the first row may be connected to a first odd-numbered transfer line TF_1o, and sub-pixels of the even-numbered sub-set R1_Ce of the first row may be connected to a first even-numbered transfer line TF_1e. That is, the sub-pixels of the odd-numbered sub-set R1_Co of the first row and the sub-pixels of the even-numbered sub-set R1_Ce of the first row may be independent of each other.

In other words, the even-numbered sub-set R1_Ce of the first row may be read out to form the second sub-frame sFR2 while the odd-numbered sub-set R1_Co of the first row is exposed to form the first sub-frame sFR1. Alternatively, the even-numbered sub-set R1_Ce of the first row may be exposed to form the second sub-frame sFR2 while the odd-numbered sub-set R1_Co of the first row may be read out to form the first sub-frame sFR1.

The second sub-set sFR2 which is generated based on the even-numbered sub-sets R1_Ce, R3_Ce, R5_Ce, and R7_Ce of the first, third, fifth, and seventh rows ma have the Bayer pattern, and a description thereof may be similar to that given with respect to FIG. 6. A description thereof is thus omitted.

Figure 8:
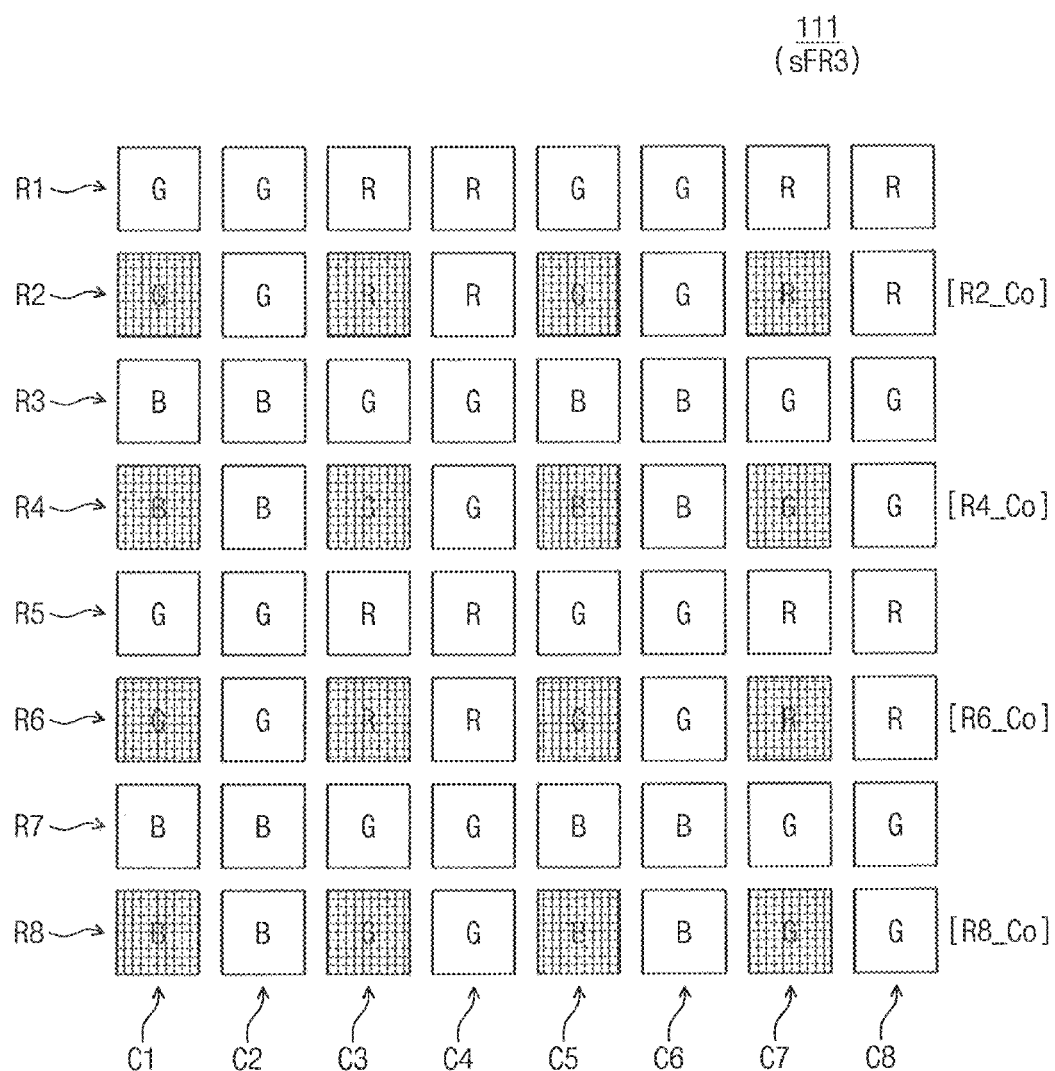

Referring to FIG. 8, the pixel array 111 may include a plurality of sub-pixels. The plurality of sub-pixels may be arranged along the first to eighth rows R1 to R8 and the first to eighth columns C1 to C8, and each of the plurality of sub-pixels may include a green color filter, a red color filter, or a blue color filter.

Sub-pixels, belonging to odd-numbered columns (e.g., C1, C3, C5, and C7), from among sub-pixels at the second row R2 may be an odd-numbered sub-set R2_Co of the second row. Sub-pixels, belonging to odd-numbered columns (e.g., C1, C3, C5, and C7), from among sub-pixels at the fourth row R4 may be an odd-numbered sub-set R4_Co of the fourth row. Sub-pixels, belonging to odd-numbered columns (e.g., C1, C3, C5, and C7), from among sub-pixels at the sixth row R6 may be an odd-numbered sub-set. R6_Co of the sixth row. Sub-pixels, belonging to odd-numbered columns (e.g., C1, C3, C5, and C7), from among sub-pixels at the eighth row R8 may be an odd-numbered sub-set R8_Co of the eighth row.

The odd-numbered sub-sets R2_Co, R4_Co, R6_Co, and R8_Co of the second, fourth, sixth, and eighth rows may constitute a third sub-frame sFR3. For example, the third sub-frame sFR3 may be generated based on data captured by sub-pixels of the odd-numbered sub-sets R2_Co, R4_Co, R6_Co, and R8_Co of the second, fourth, sixth, and eighth rows.

The third sub-frame sFR3 which is generated based on the odd-numbered sub-sets R2_Co, R4_Co, R6_Co, and R8_Co at the second, fourth, sixth, and eighth rows may have the Bayer pattern. A description thereof may be similar to that given with respect to FIG. 6, and thus, may be omitted.

Figure 9:
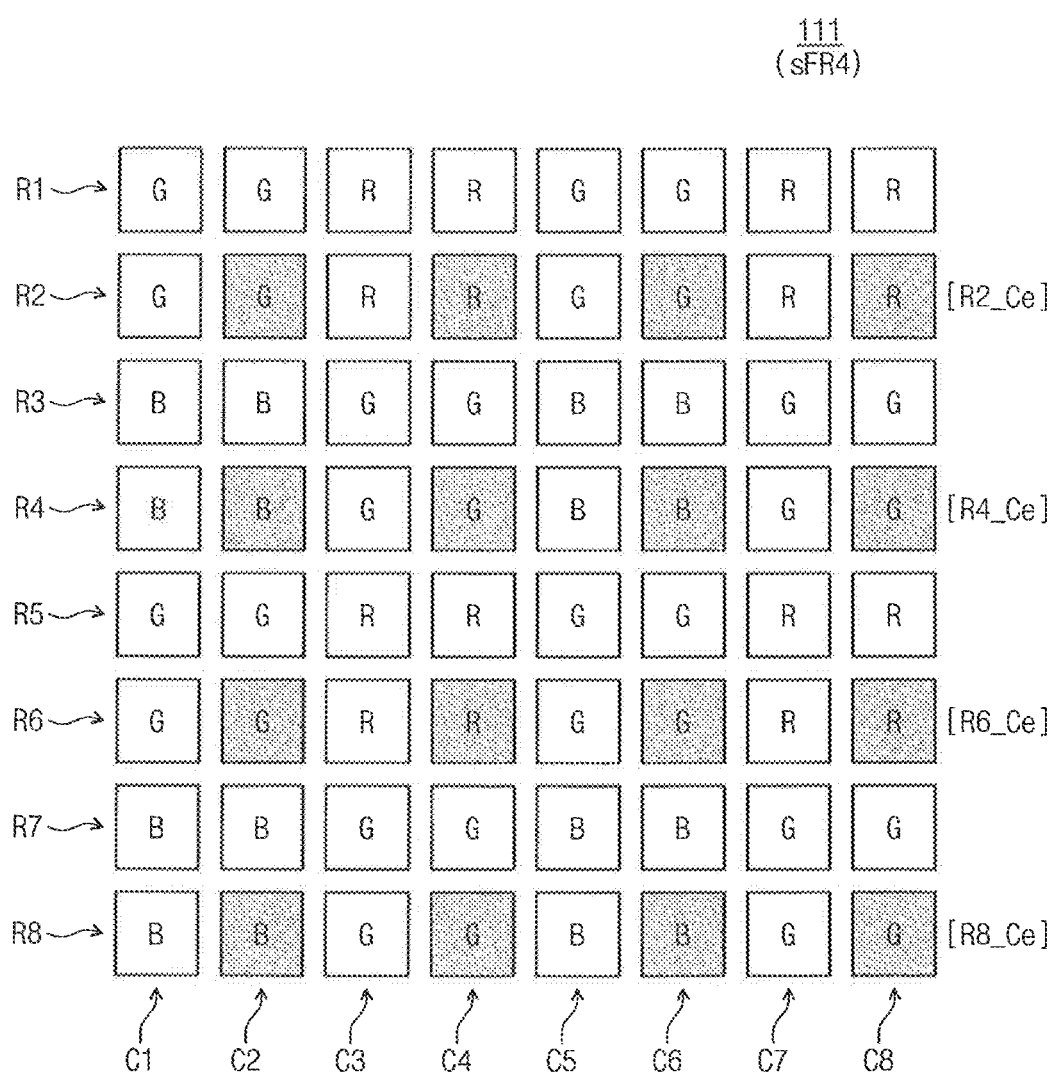

Referring to FIGS. 2 and 9, the pixel array 111 may include a plurality of sub-pixels. The plurality of sub-pixels may be arranged along the first to eighth rows R1 to R8 and the first to eighth columns C1 to C8, and each of the plurality of sub-pixels may include a green color filter, a red color filter, or a blue color filter.

Sub-pixels, belonging to even-numbered columns (e.g., C2, C4, C6, and C8), from among sub-pixels at rite second row R2 may be an even-numbered sub-set R2_Ce of the second row. Sub-pixels, belonging to even-numbered columns (e.g., C2, C4, C6, and C8), from among sub-pixels at the fourth row R4 may be an even-numbered sub-set R4_Ce of the fourth row. Sub-pixels, belonging to even-numbered columns (e.g., C2, C4, C6, and C8), from among sub-pixels at the sixth row R6 may be an even-numbered sub-set R6_Ce of the sixth row. Sub-pixels, belonging to even-numbered columns (e.g., C2, C4, C6, and C8), from among sub-pixels at the eighth row R8 may be an even-numbered sub-set R8_Ce of the eighth row.

The even-numbered sub-sets R2_Ce, R4_Ce, R6_Ce, R8_Ce of the second, fourth, sixth, and eighth rows may constitute a fourth sub-frame sFR4. For example, the fourth sub-frame sFR4 may be generated based on data captured by sub-pixels of the even-numbered sub-sets R2_Ce, R4_Ce, R6_Ce, R8_Ce of the second, fourth, sixth, and eighth rows.

The fourth sub-frame sFR4 which is generated based on the even-numbered sub-sets R2_Ce, R4_Ce, R6_Ce, R8_Ce of the second, fourth, sixth, and eighth rows may have the Bayer pattern. A description thereof may be similar to that given with respect to FIG. 6 and may be thus omitted.

Although not illustrated, the first to fourth sub frames sFR1 to sFR4 may be generated based on first to fourth sub-arrays of the pixel array 111, respectively. For example, the first sub-array may indicate arrangement which is defined by a first row group (e.g., a group of odd-numbered rows) and a first column group (e.g., a group of odd-numbered columns). That is, the first sub-array may indicate arrangement of sub-pixels which constitute the first sub-frame sFR1 illustrated in FIG. 6.

Likewise, the second sub-frame sFR2 may include sub-pixels on the second sub-array. In this case, the second sub-array may indicate arrangement which is defined by the first row group (e.g., a group of odd-numbered rows) and a second column group (e.g., a group of even-numbered columns). The third sub-frame sFR3 may, include sub-pixels on the third sub-array. In this case, the third sub-array may indicate arrangement which is defined by a second row group (e.g., a group of even-numbered rows) and the first column group (e.g., a group of odd-numbered columns). The fourth sub-frame sFR4 may include sub-pixels on the fourth sub-array. In this case, the fourth sub-array may indicate arrangement which is defined by the second row group (e.g., a group of even-numbered rows) and the second column group (e.g., a group of even-numbered columns).

As described with reference to FIGS. 6 to 9, the image sensor module 110 may generate the first to fourth sub-frames sFR1 to sFR4. In this case, since each of the first to fourth sub-frames sFR1 to sFR4 is generated based on a part of a plurality of sub-pixels included in the pixel array 111, the image sensor module 110 may read each of the first to fourth sub-frames sFR1 to sFR4 at high speed.

In example embodiments, the image sensor module 110 may sequentially readout the first to fourth sub-frames sFR1 to sFR4. Alternatively, the image sensor module 110 may randomly readout the first to fourth sub-frames sFR1 to sFR4, respectively. As another example, the image sensor module 110 may sequentially readout the first to fourth sub-frames sFR1 to sFR4 by the row or may randomly readout the first to fourth sub-frames sFR1 to sFR4 by the row. Alternatively, the image sensor module 110 may change an exposure time with respect to each of the first to fourth sub-frames sFR1 to sFR4.

Below, a sub-frame readout method of the image sensor module 110 will be described in detail with reference to FIGS. 10 to 14.

FIGS. 10 to 13 are timing diagrams for describing an operation of an image sensor module of FIG. 1. In FIGS. 10 to 13, an x-axis represents a time, and a y-axis represents rows or sub-sets of rows of the pixel array 111 of the image sensor module 110.

For ease of illustration and descriptive convenience, components which are not needed to describe a technical feature of the inventive concept may be omitted. Furthermore, components or reference numerals which are described above or are duplicated may be omitted.

In addition, for ease of illustration and descriptive convenience, rows of the pixel array 111 may be illustrated in FIGS. 10 to 13 based on, but not limited thereto, a unit corresponding to a sub-frame sFR. The timing diagrams illustrated in FIGS. 10 to 13 are example embodiments for clearly describing the technical feature of the inventive concept, but the scope and spirit of the inventive concept may not be limited thereto.

For ease of illustration, in FIGS. 10 to 13, an embodiment of the inventive concept is exemplified as each of first to fourth sub-frames sFR1 to sFR4 are read out once. However, the scope and spirit of the inventive concept may not be limited thereto. For example, the image sensor module 110 may continuously read a plurality of sub-frames.

Furthermore, a sub-frame length or a vertical synchronization period may be illustrated with any size for ease of illustration. However, the scope and spirit of the inventive concept may not be limited thereto.

In addition, the number of sub-frames, the number of rows of the pixel array 111, the number of columns of the pixel array 111, the number of sub-pixels, a color filter array CFA, and the like are example, and the scope and spirit of the inventive concept may not be limited thereto.

Referring to FIGS. 6 to 10, the image sensor module 110 may sequentially read the first to fourth sub-frames sFR1 to sFR4 from t00 to t23.

For example, the image sensor module 110 may read the first sub-frame sFR1 from t00 to t11. In particular, from t00 to t08, the image sensor module 110 may perform a sensing operation about sub-pixels of an odd-numbered sub-set R1_Co of a first row. The sensing operation may include a reset operation, an exposure operation, and a readout operation. In example embodiments, a time associated with the sensing operation may indicate a frame length of a sub-frame sFR.

During a sensing operation about the odd-numbered sub-set R1_Co of the first row, at t01, the image sensor module 110 may start a sensing operation about an odd-numbered sub-set R3_Co of a third row. Likewise, at t02, the image sensor module 110 may start a sensing operation about an odd-numbered sub-set R5_Co of a fifth row. At t03, the image sensor module 110 may perform a sensing operation about an odd-numbered sub-set R7_Co of a seventh row.

At t08 when the sensing operation about the odd-numbered sub-set R1_Co of the first row is completed, the image sensor module 110 may read data captured by sub-pixels of the odd-numbered sub-set R1_Co of the first row.

Likewise, at t09, t10, and t11 when sensing operations about odd-numbered sub-sets R3_Co, R5_Co, and R7_Co of third, fifth, and seventh rows are respectively completed, the image sensor module 110 may read data captured by sub-pixels of each of the odd-numbered sub-sets R3_Co, R5_Co, and R7_Co of third, fifth, and seventh rows.

The image sensor module 110 may generate a first sub-frame sFR1 based on the read data. In example embodiments, the first sub-frame sFR1 (or first sub-frame data) thus generated may be provided to the image signal processing unit 120 (refer to FIG. 1).

As described above, the image sensor module 110 may sequentially read the second to fourth sub-frames sFR2 to sFR4. For example, from t04 to t15, the image sensor module 110 may sequentially read data captured by sub-pixels of respective even-numbered sub-sets R1_Ce, R3_Ce, R5_Ce, and R7_Ce of the first, third, fifth, and seventh rows and may generate the second sub-frame sFR2 based on the read data.

From t08 to t19, the image sensor module 110 may sequentially read data captured by sub-pixels of respective even-numbered sub-sets R2_Co, R4_Co, R6_Co, and R8_Co of the second, fourth, sixth, and eighth rows and may generate the third sub-frame sFR3 based on the read data.

From t12 to t23, the image sensor module 110 may sequentially read data captured by sub-pixels of each of even-numbered sub-sets R2_Ce, R4_Ce, R6_Ce, and R8_Ce of second, fourth, sixth, and eighth rows and may generate the fourth sub-frame sFR4.

As described above, the image sensor module 110 may sequentially read the first to fourth sub-frames sFR1 to sFR4. In this case, the image sensor module 110 may sequentially read sub-sets of rows constituting each of the first to fourth sub-frames sFR1 to sFR4.

In example embodiments, the first to fourth sub-frames sFR1 to sFR4 thus read may be provided to the image signal processing unit 120 (refer to FIG. 1), and the image signal processing unit 120 may generate an image or photo of a full frame or a high-speed image based on the first to fourth sub-frames sFR1 to sFR4.

Referring to FIGS. 6 to 9 and 11, the image sensor module 110 may read the first to fourth sub-frames sFR1 to sFR4.

Unlike an embodiment described with reference to FIG. 10, the image sensor module 110 may randomly read out the first to fourth sub-frames sFR1 to sFR4, respectively.

Figure 10:
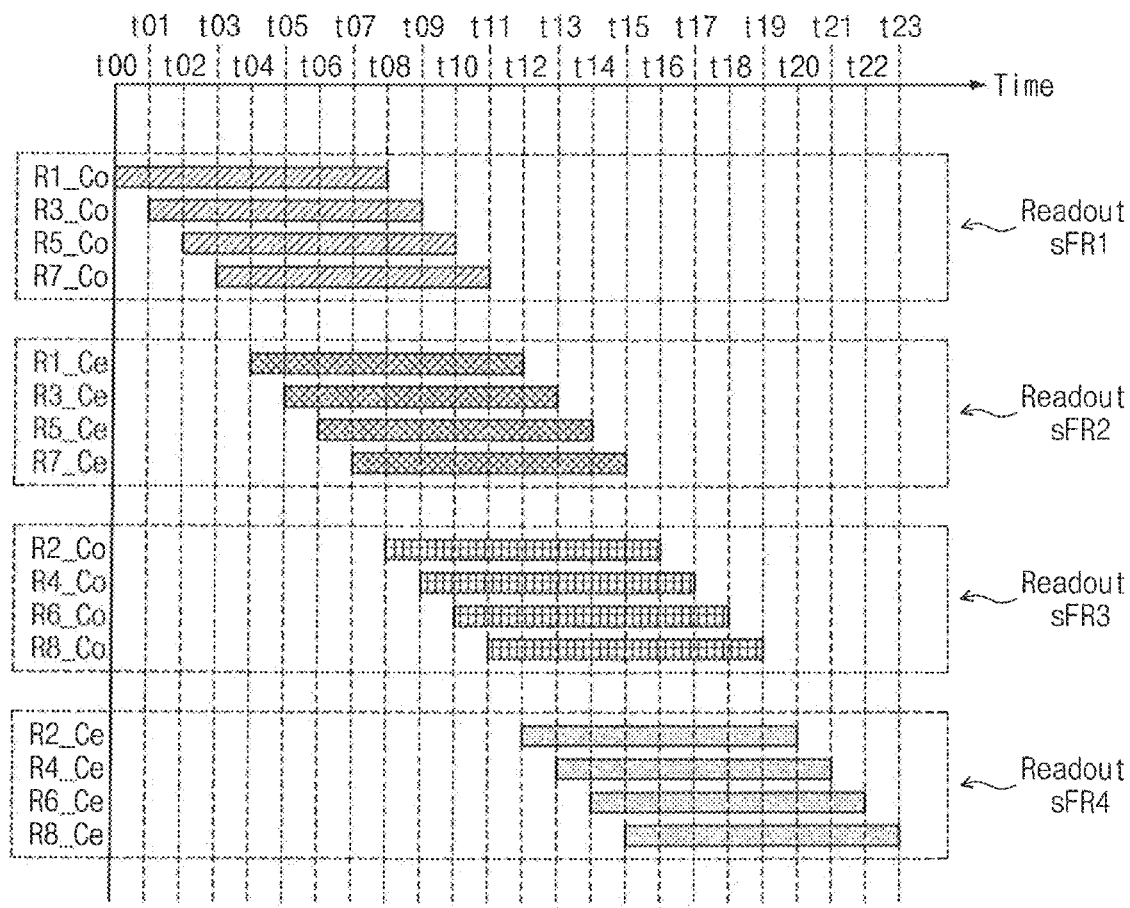
FIGS. 10 to 13 are timing diagrams for describing an operation of an image sensor module of FIG. 1.

For example, in an embodiment of FIG. 10, the image sensor module 110 may sequentially read the first to fourth sub-frames sFR1 to sFR4. However, in an embodiment of FIG. 11, the image sensor module 110 may start a sensing operation for reading out the second sub-frame sFR2 which is generated by even-numbered sub-sets R1_Ce, R3_Ce, R5_Ce, and R7_Ce of the first, third, fifth, and seventh rows. Afterwards, the image sensor module 110 may read sub-frames in the following order: sFR4→sFR3→sFR1. In example embodiments, when each sub-frame is read out, an order of sensing operations about sub-sets of rows may be the same as FIG. 10.

Figure 11:
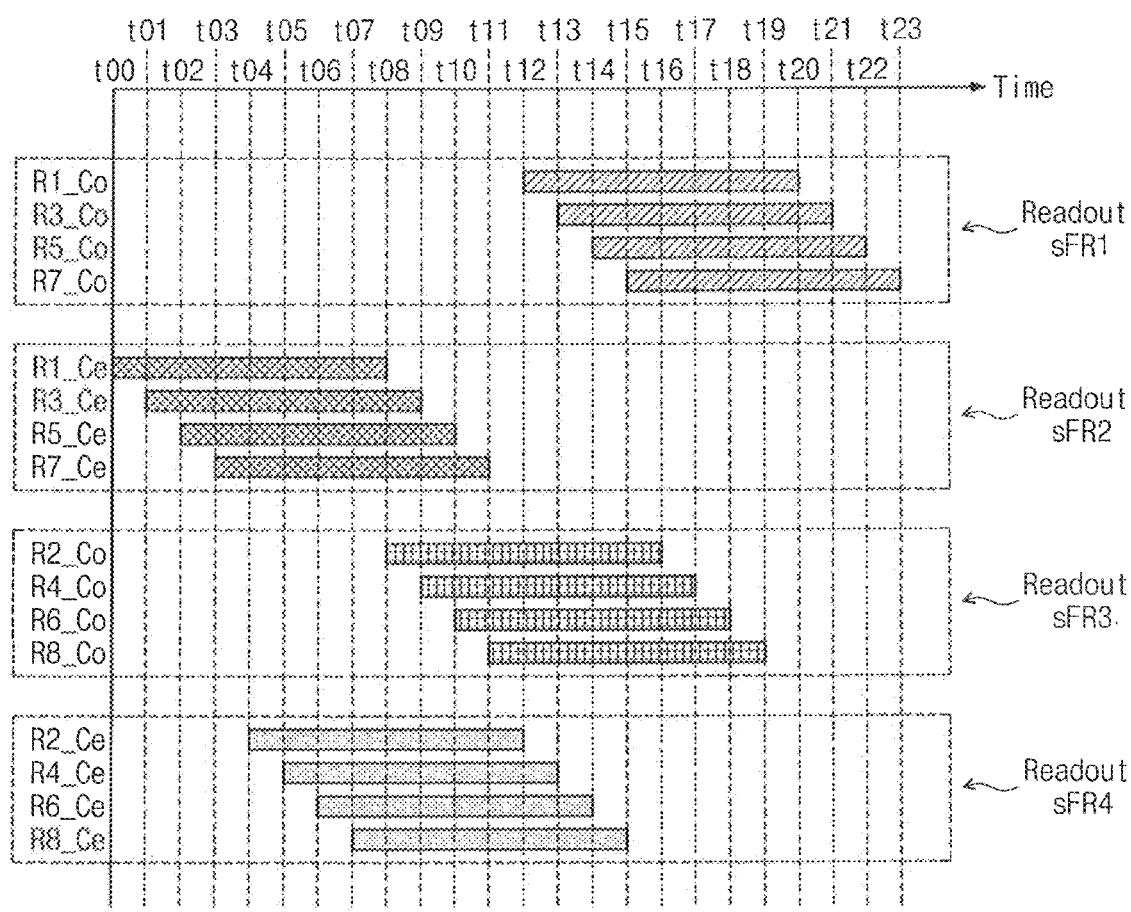
Figure 12:
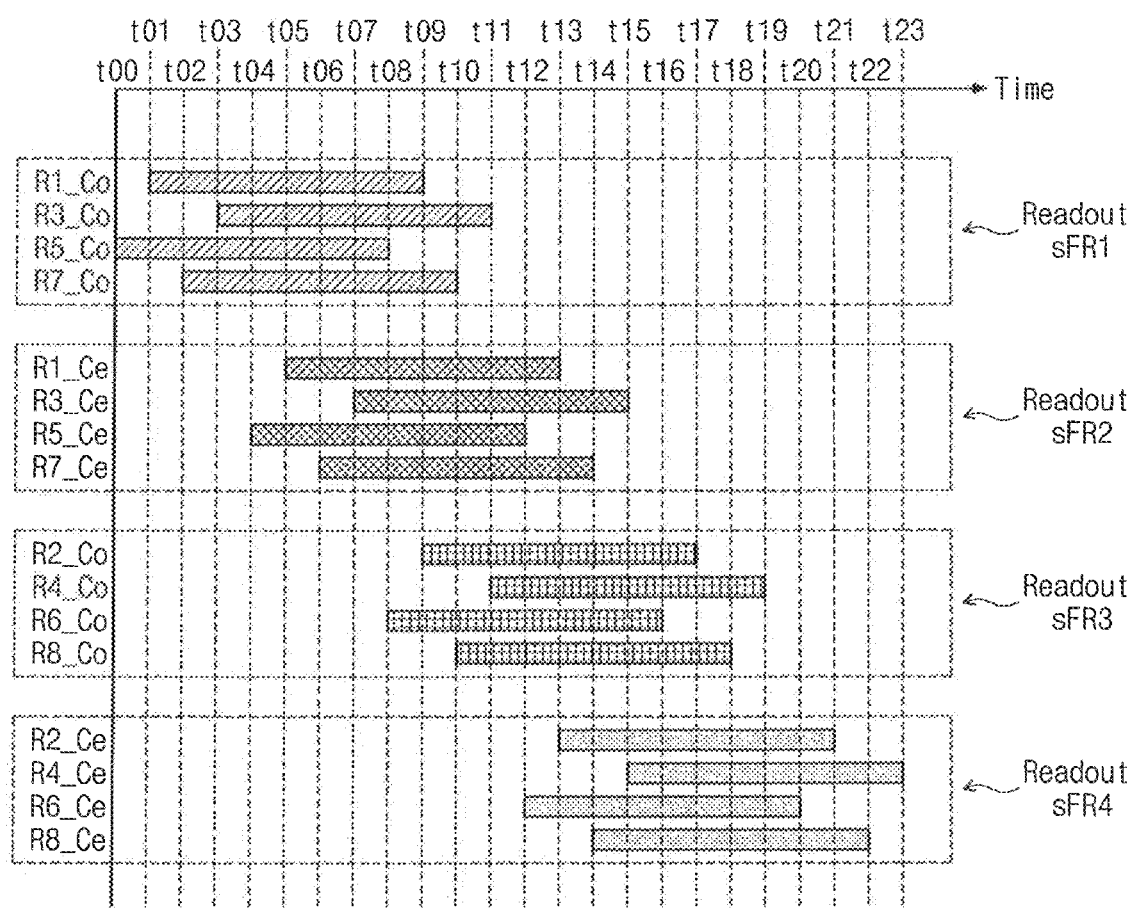

That is, in FIG. 11, the image sensor module 110 according to an example embodiment of the inventive concept may read out the first to fourth sub-sets sFR1 to sFR4 in any order or a predetermined order.

A sub-frame read order illustrated in FIG. 11 is example, not limiting the scope and spirit of the inventive concept. The sub-frame read order may be variously changed or modified.

Referring to FIGS. 6 to 9 and 12, the image sensor module 110 may read the first to fourth sub-frames sFR1 to sFR4.

In example embodiments, the image sensor module 110 may sequentially read the first to fourth sub-frames sFR1 to sFR4, respectively. Unlike an embodiment of FIG. 10, in FIG. 12, the image sensor module 110 according to an example embodiment of the inventive concept may read sub-sets of rows in one sub-frame in any order or non-sequentially. For example, to read the first sub-frame sFR1, the image sensor module 110 may perform sensing operations about odd-numbered sub sets R1_Co, R3_Co, R5_Co, R7_Co of first, third, fifth, and seventh rows. In this case, the image sensor module 110 may start a sensing operation about an odd-numbered sub-set R5_Co of the fifth row and then may start a sensing operation about an odd-numbered sub-set R1_Co of the first row. Afterwards, the image sensor module 110 may start a sensing operation about an odd-numbered sub-set R7_Co of the seventh row and then may perform a sensing operation about an odd-numbered sub-set R3_Co of the third row.

With regard to each of the second to fourth sub-frames sFR2 to sFR4, sensing operations about sub-sets of rows may be performed in any order or non-sequentially. In this case, as described above, the image sensor module 110 may perform sensing operations with respect to sub-sets of each of the second to fourth sub-frames sFR2 to sFR4 in any order or non-sequentially.

Referring to FIGS. 6 to 9, and 13, the image sensor module 110 may read the first to fourth sub-frames sFR1 to sFR4. In this case, the image sensor module 110 may read the first to fourth sub-frames sFR1 to sFR4 in any order or non-sequentially. A non-sequential read operation about sub-frames may be similar to a read method described with reference to FIG. 11. Furthermore, the image sensor module 110 may read sub-sets of rows of each of the first to fourth sub-frames sFR1 to sFR4 in any order or non-sequentially.

Figure 13:
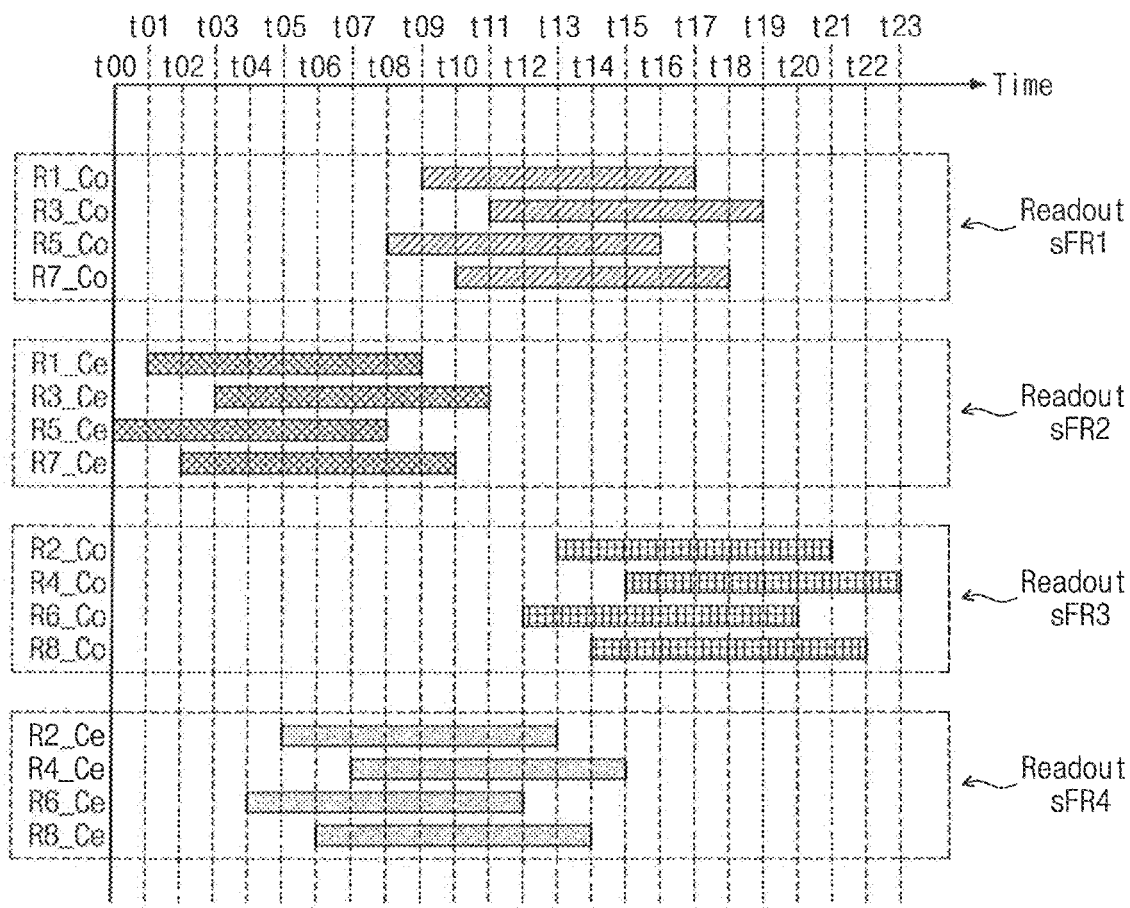

That is, according to a timing time illustrated in FIG. 13, the image sensor module 110 may read the first to fourth sub-frames sFR1 to sFR4 in any order or non-sequentially and may also read sub-sets of rows in each sub-frame in any order or non-sequentially.

In example embodiments, a read order about the first to fourth sub-frames sFR1 to sFR4 and a read order about sub-sets of rows in each sub-frame are described with reference to FIGS. 10 to 13. Operating methods described with reference to FIGS. 10 to 13 may be example embodiments for clearly describing a technical feature of the inventive concept, and the scope and spirit of the inventive concept may not be limited thereto. Some of operating methods described with reference to FIGS. 10 to 13 may be combined or merged, and the operating methods may be variously changed or modified without departing from the scope and spirit of the inventive concept.

Figure 14:
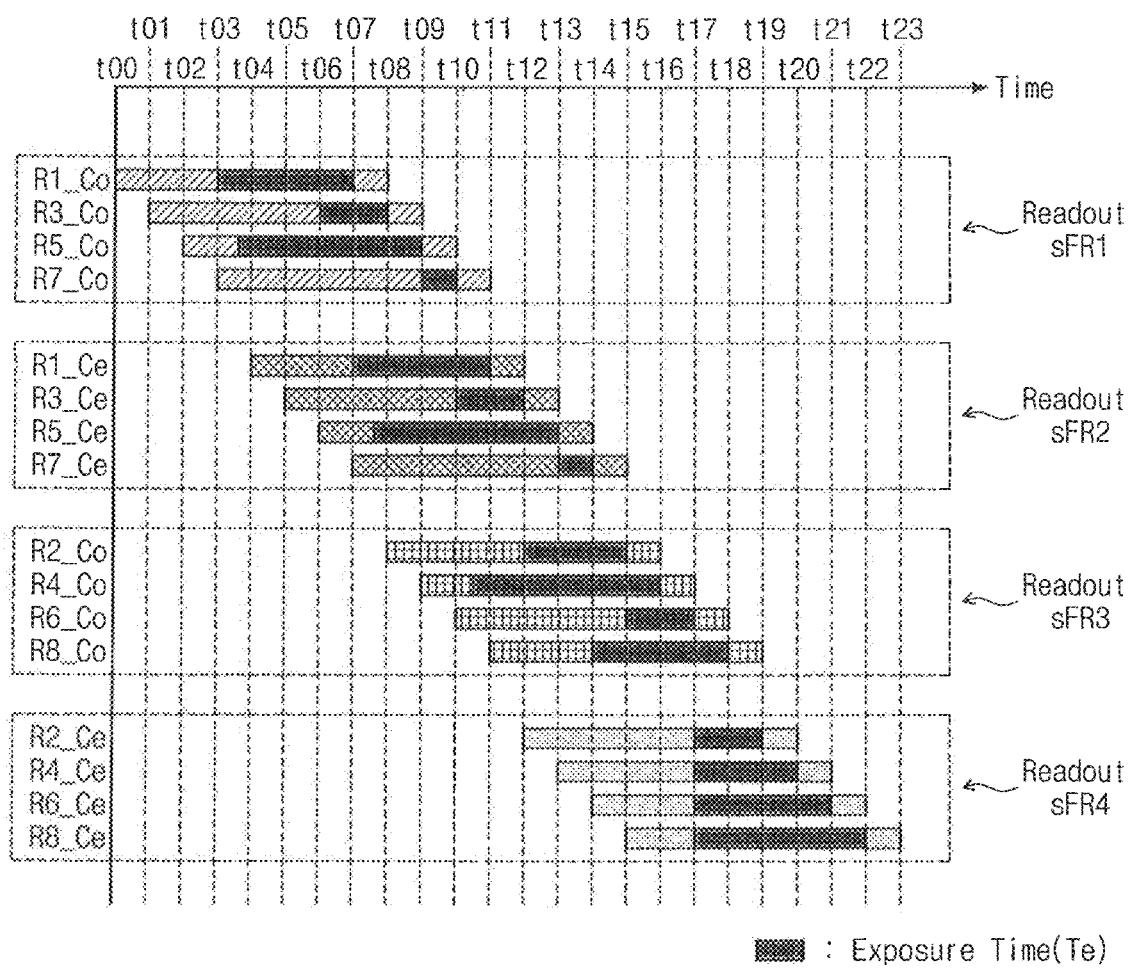
FIG. 14 is a timing diagram for describing another operating method of an image sensor module of FIG. 1.

FIG. 14 is a timing diagram for describing another operating method of an image sensor module of FIG. 1. According to a timing diagram illustrated in FIG. 14, first to fourth sub-frames sFR1 to sFR4 may be sequentially read out, and sub-sets of rows in each sub-frame may be sequentially read out. However, the scope and spirit of the inventive concept may not be limited thereto. Adjustment of an exposure time to be described with reference to FIG. 14 may be applied to operating methods described with reference to FIGS. 10 to 13 or to a combination thereof.

Referring to FIGS. 1 to 9 and 14, the image sensor module 110 may sequentially read the first to fourth sub-frames sFR1 to sFR4. The image sensor module 110 may sequentially perform sensing operations with respect to sub-sets of rows in each sub-frame. A sequential read operation about the first to fourth sub-fames sFR1 to sFR41 and a sequential sensing operation about sub-sets of rows in each sub-frame are described with reference to FIG. 10, and a detailed description thereof is thus omitted.

When sub-sets of rows in each sub-frame are sensed, the image sensor module 110 may independently adjust exposure times of sub-sets of rows in each sub-frame. The exposure time may mean a time when the photodiode PD (refer to FIG. 4) is charged with charges by external light. For example, as described with reference to FIG. 4, after a voltage on the first node n1 is reset by the reset transistor TR_RST, the transfer transistor TR_TF may be turned, and thus, a voltage on the first node n1 may be changed due to charges generated from the photodiode PD. In this case, the exposure time may mean from a point in time when a sub-pixel is reset to a point in time when the transfer transistor TR_TF is turned on.

As described with reference to FIG. 5, odd-numbered and even-numbered sub-sets in the same row may be connected to different transfer lines, respectively. That is, the image sensor module 110 may independently adjust exposure times of the odd-numbered sub-set and even-numbered sub-set in the same row.

For example, the image sensor module 110 may perform sensing operations about odd-numbered sub-sets R1_Co, R3_Co, R5_Co, R7_Co of first, third, fifth, and seventh rows to read a first sub-frame sFR1. In this case, the image sensor module 110 may adjust an exposure time about the odd-numbered sub-set R1_Co of the first row with a time ranging from t03 to t07. That is, the odd-numbered sub-set of the first row may be reset at t03, and charges generated by photodiodes PD in sub-pixels of the odd-numbered sub-set R1_Co of the first row may be sensed at t07.

Likewise, the image sensor module 110 may differently adjust exposure times of odd-numbered sub-sets R3_Co, R5_Co, and R7_Co of the third, fifth, and seventh rows.

The image sensor module 110 may differently adjust exposure times of sub-sets (e.g., R1_Ce, R3_Ce, R5_Ce, R7_Ce, R2_Co, R4_Co, R6_Co, R8_Co, R2_Ce, R4_Ce, R6_Ce, and R8_Ce) of rows in each of the second to fourth sub-frames sFR2 to sFR4.

Exposure times of sub-sets of rows in each sub-frame illustrated in FIG. 14 are example, and changes or modifications about the exposure times may be variously made. Although not illustrated, an exposure time may be differently set by a sub-frame unit, a row unit, or a sub-set unit of a row.

According to an embodiment described with reference to FIG. 14, as exposure times of sub-frames or exposure times of sub-sets of rows in each sub-frame are differently set, the first to fourth sub-frames sFR1 to sFR4 may have pieces of image data of which the brightness is different from each other. The image signal processing unit 120 (refer to FIG. 1) may generate a full frame FR based on the first to fourth sub-frames sFR1 to sFR4, thereby making it possible to provide the HDR or WDR function.

Figure 15:
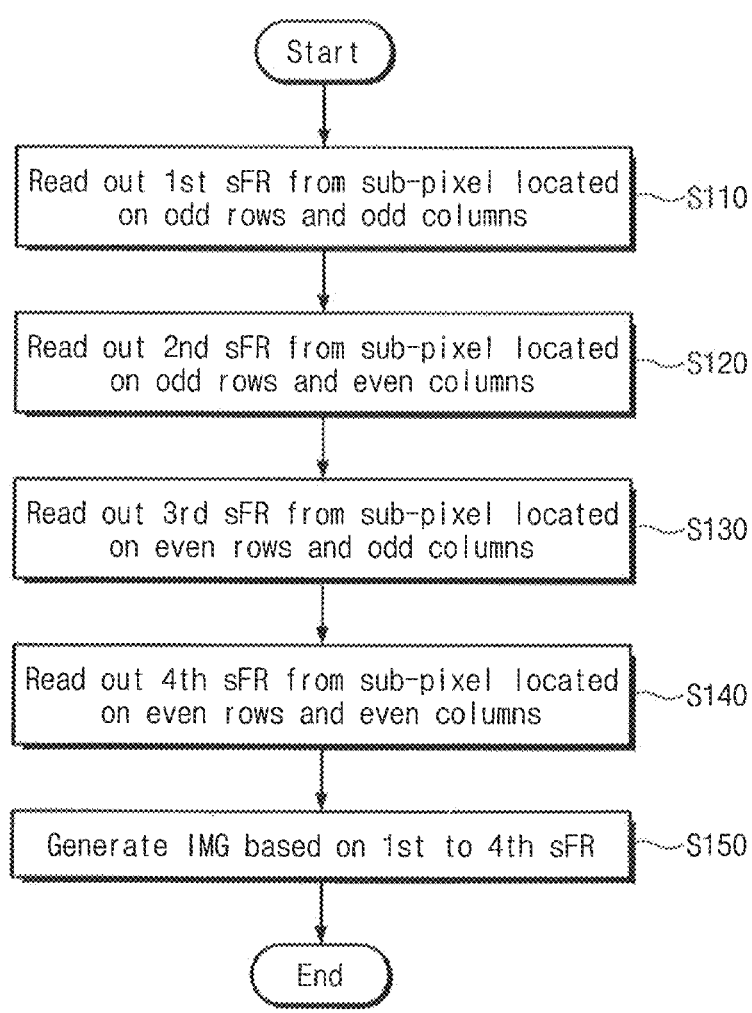
FIG. 15 is a flow chart schematically illustrating an operation of an image sensor module of FIG. 2.

FIG. 15 is a flow chart schematically illustrating an operation of an image sensor module of FIG. 2. Referring to FIGS. 2 and 6 to 15, in step S110, the image sensor module 110 may read a first sub-frame from sub-pixels at odd rows and odd columns of the pixel array 111.

In step S120, the image sensor module 110 may read a second sub-frame sFR2 from sub-pixels at the odd rows and even columns of the pixel array 111.

In step S130, the image sensor module 110 may read a third sub-frame sFR3 from sub-pixels at the even rows and the odd rows of the pixel array 111.

In step S140, the image sensor module 110 may read a fourth sub-frame sFR4 from sub-pixels at the even rows and the even columns of the pixel array 111.

In example embodiments, operations corresponding to steps S110 to S140 may be performed based on an operating method described with reference to FIGS. 10 to 14. An order of the operations corresponding to steps S110 to S140 may not be limited to this disclosure. For example, the operations corresponding to steps S110 to S140 may be performed according to arty order or non-sequentially. Alternatively, a part or all of operations corresponding to steps S110 to S140 may be performed in parallel.

In step S150, the image sensor module 110 may generate a first frame (i.e., a full frame) based on the first to fourth frames sFR1 to SFR4 thus generated. In example embodiments, an operation corresponding to step S150 may be performed by the image signal processing unit 120 (refer to FIG. 1). Furthermore, the first frame which is generated based on the first to fourth frames sFR1 to sFR4 may be photo data or image data including a plurality of frames.

According to embodiments of the inventive concept, the image sensor module 110 may generate a sub-frame by the sub-sets of rows. At this time, the image sensor module 110 may read a plurality of sub-frames sequentially or non-sequentially. Alternatively, the image sensor module 110 may perform sensing operations about sub-sets of rows of each sub-frame sequentially or non-sequentially or may independently adjust an exposure time by the sub-frame or the sub-set of a row. Accordingly, image data may be read at high speed, and a function such as HDR or WDR may be supported. This may mean that the performance of the image sensor module 110 is increased.

Furthermore, each of sub-frames read by the image sensor module 110 may have a general color filter array pattern such as a Bayer pattern, a RGBE pattern, a CYGM pattern, a CYYM pattern, and the like, thereby increasing the performance of a user system without an additional change about the image signal processing unit 120.

Figure 16:
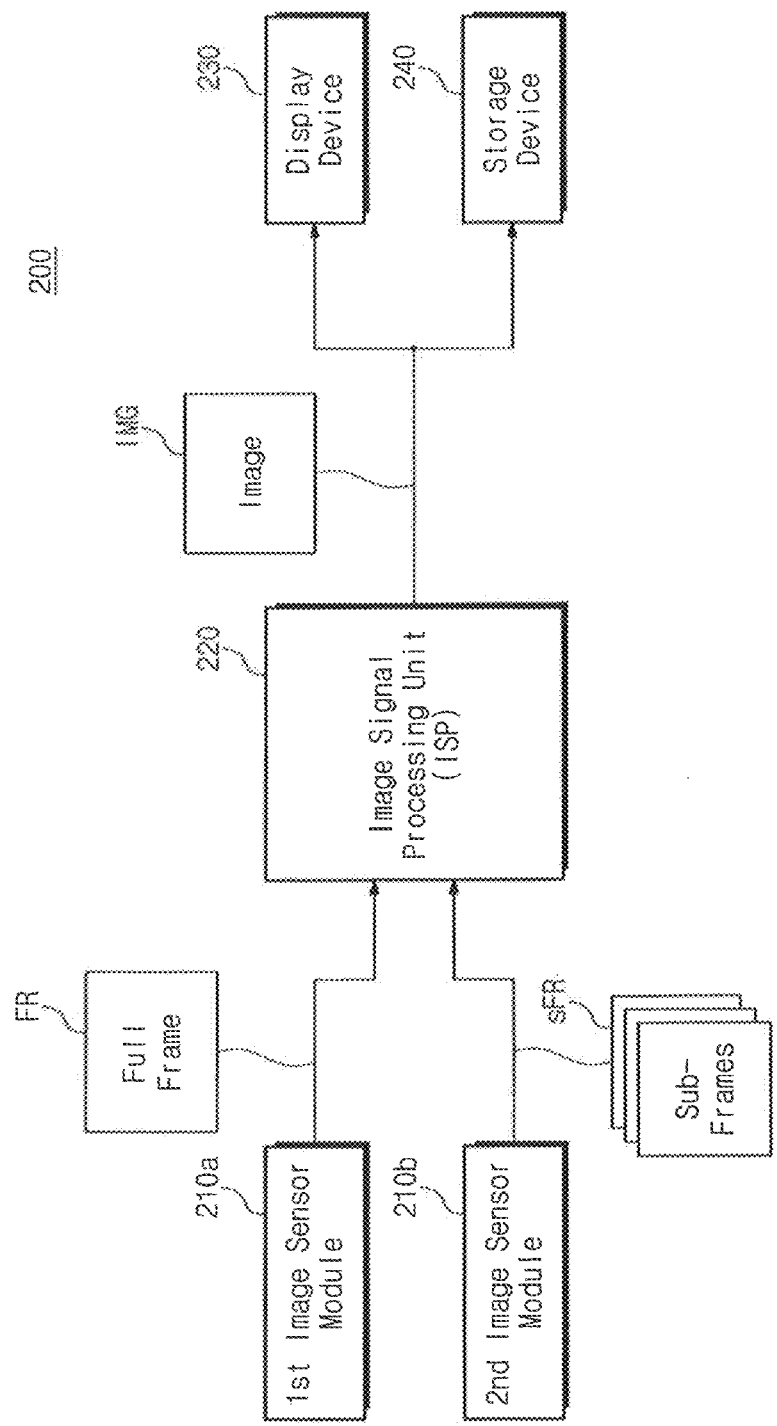
FIG. 16 is a block diagram schematically illustrating a user system according to another example embodiment of the inventive concept.

FIG. 16 is a block diagram schematically illustrating a user system according to another example embodiment of the inventive concept. Referring to FIG. 16, a user system 200 may include a first image sensor module 210a, a second image sensor module 210b, an image signal processing unit 220, a display device 230, and a storage device 240.

In example embodiments, the user system 200 may be a dual-camera system. The dual-camera system may use one image sensor module as a reference image sensor module and the other image sensor module as an auxiliary image sensor module. Frame data read from the reference image sensor module may be used as a reference frame, and frame data read from the auxiliary image sensor module may be used as an auxiliary frame. In this case, the quality of an image about the reference frame may be increased, or a three-dimensional may be provided.

In example embodiments, the first image sensor module 210a may be the reference image sensor module, and the second image sensor module 210b may be the auxiliary image sensor module. In example embodiments, the first image sensor module 210a may be a general image sensor module. For example, the first image sensor module 210a may an image sensor module which includes a color filter array of a Bayer pattern and operates in a rolling shutter manner.

The second image sensor module 210b may be an image sensor module described with reference to FIGS. 1 to 15. That is, the second image sensor module 210b may be to read a plurality of sub-frames sFR based on an operating method described with reference to FIGS. 1 to 15. For example, the second in age sensor module 210b may include a color filter array of a pattern described with reference to FIG. 3; in the case where first to fourth sub-frames sFR1 to sFR4 are read out according to an operating method described with reference to FIGS. 4 to 15, the first to fourth sub-frames sFR1 to sFR4 may be read out from the second image sensor module 210b while one frame is read out from the first image sensor module 210a.

That is, one frame FR read out from the first image sensor module 210a may correspond to at least two sub-frames read out from the second image sensor module 210b.

The image signal processing unit 220 may receive a frame from the first image sensor module 210a and sub-frames sFRs from the second image sensor module 210b. The image signal processing unit 220 may correct the frame FR from the first image sensor module 210a using the sub-frames sFRs from the second image sensor module 210b. For example, the image signal processing unit 220 may use the frame from the first image sensor module 210a as the reference frame and the sub-frames sFR from the second image sensor module 210b as the auxiliary frame. The image signal processing unit 220 may remove noise, blur, and the like of the reference frame using the sub-frames sFRs being the auxiliary frame or may perform signal processing such as brightness correction, color correction, and the like, and thus, may output image or photo data.

The display device 230 may output image or photo data, which is received from the image signal processing unit 220, through a display panel. The storage device 240 may store image or photo data.

Figure 17:
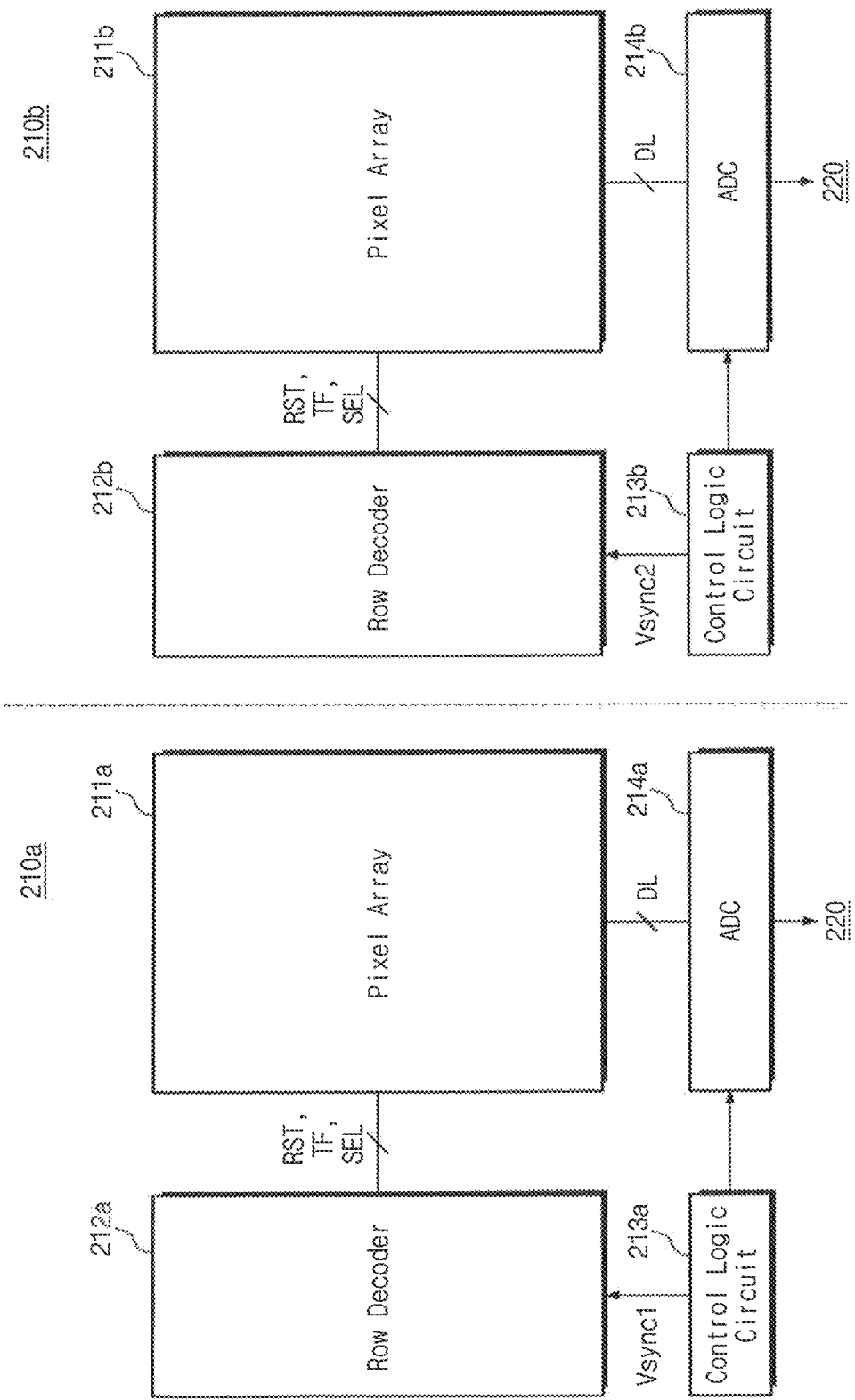
FIG. 17 is a block diagram schematically illustrating first and second image sensor modules of FIG. 16.
Figure 18:
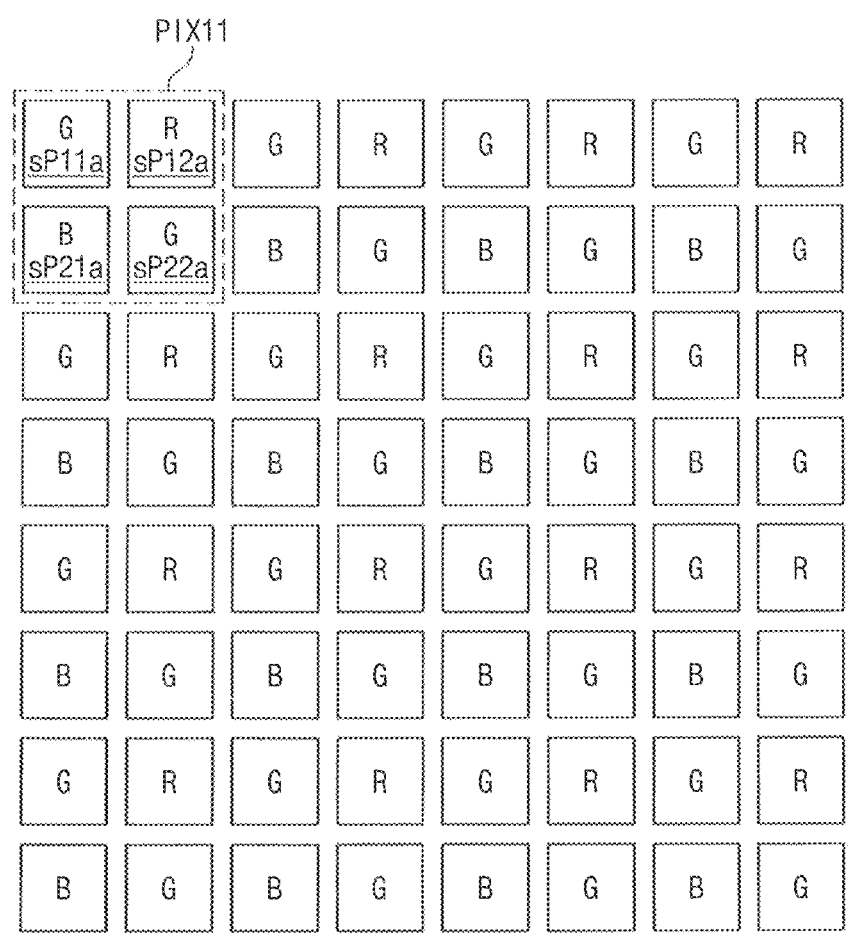
FIG. 18 is a diagram schematically illustrating a pixel array (or a color filter array) of a first image sensor module of FIG. 17.

FIG. 17 is a block diagram schematically illustrating first and second image sensor modules of FIG. 16. FIG. 18 is a diagram schematically illustrating a pixel array or a color filter array) of a first image sensor module of FIG. 17. In example embodiments, each of the first and second image sensor modules 210a and 210b may have a structure similar to the image sensor module 110 described with reference to FIG. 2. In example embodiments, a pixel array 211b of the second image sensor module 210b may be the same as the pixel array 111 (or a color filter array) described with reference to FIGS. 3 and 4. In example embodiments, the first and second image sensor modules 210a and 210b may be implemented with one image sensor device.

In FIG. 18, an embodiment of the inventive concept is exemplified as the pixel array 211a of the first image sensor module 210a includes 8-by-8 sub-pixels. However, the scope and spirit of the inventive concept may not be limited thereto.

Referring to FIGS. 17 and 18, the first image sensor module 210a may include the pixel array 211a, a row decoder 212a, a control logic circuit 213a, and an ADC 214a. The second image sensor module 210b may include the pixel array 211b, a row decoder 212b, a control logic circuit 213b, and an ADC 214b.

Components of each of the first and second image sensor modules 210a and 210b may be the same as those of the image sensor module 110 described with reference to FIG. 3, and a detailed description thereof is thus omitted.

As illustrated in FIG. 17, the first and second image sensor modules 210a and 210b may be implemented with different modules and may operate independently of each other.

As illustrated in FIG. 18, the pixel array 211a of the first image sensor module 210a may include a plurality of pixels PIX, each of which contains a plurality of sub-pixels. For example, a pixel PIX11a may include four sub-pixels sP11a, sP12a, sP21a, and sP22a. The sub-pixel sP11a may include a green color filter, the sub-pixel sP12a may include a red color filter, the sub-pixel sP21a may include a blue color filter, and the sub-pixel sP22a may include a green color filter.

In example embodiments, a plurality of sub-pixels may be arranged in first to eighth rows R1a to R8a and first to eighth columns C1a to C8a.

In example embodiments, the pixel array 211b of the second image sensor module 210b may be the same as the pixel array 111 described with reference to FIG. 3. That is, in the pixel array 211b of the second image sensor module 210b, four pixels PIX adjacently arranged may constitute one Bayer pattern. However, in the pixel array 211a of the first image sensor module 210a, four adjacently arranged sub-pixels (e.g., sP11a, sP12a, sP21a, and sP22a) may compose one Bayer pattern.

Figure 19:
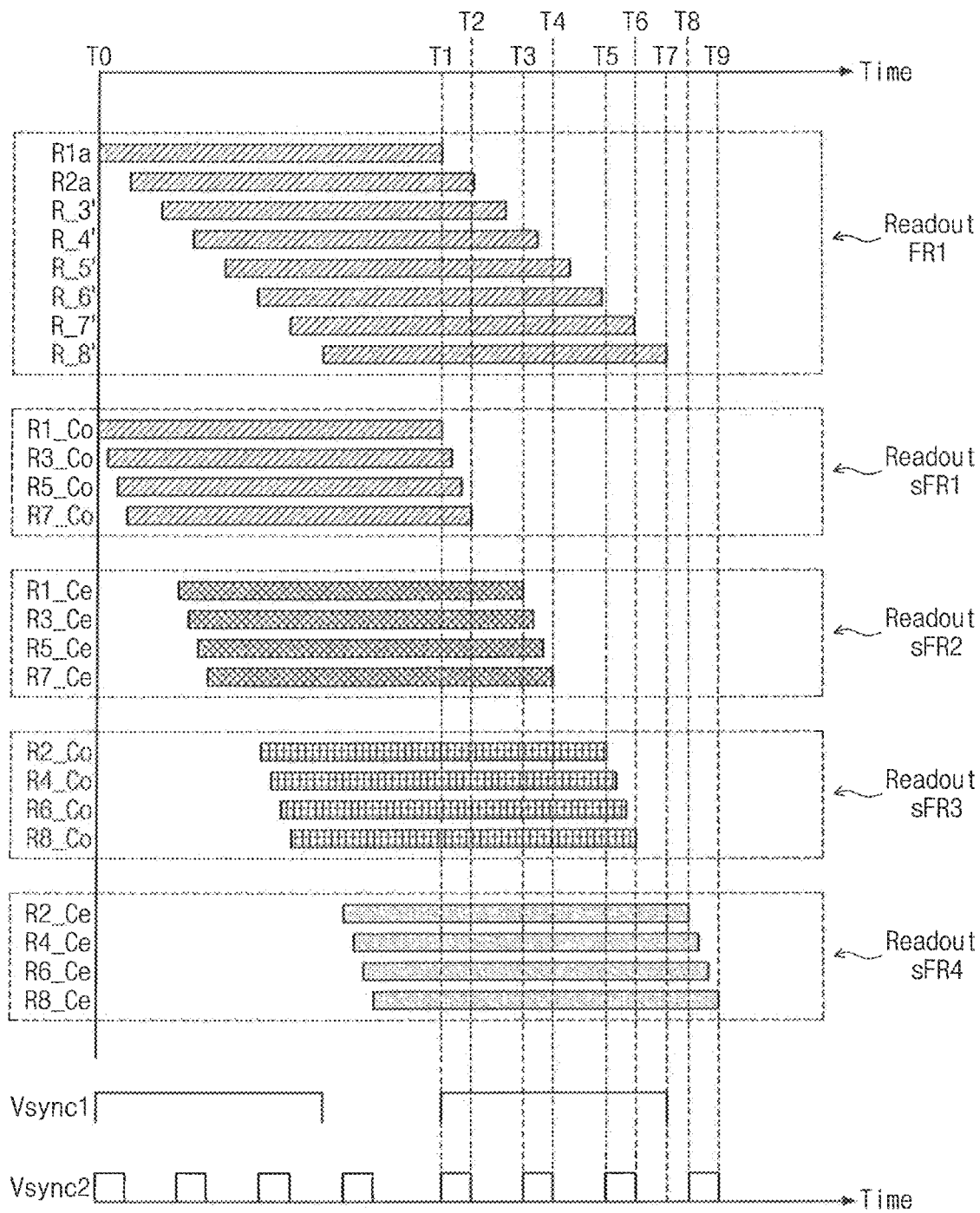
FIG. 19 is a timing diagram for describing a frame read method of first and second image sensor modules of FIG. 17.

FIG. 19 is a timing diagram for describing a frame read method of first and second image sensor modules of FIG. 17. For ease of illustration and for descriptive convenience, it is assumed that the first image sensor module 210a reads a first frame FR1 once and the second image sensor module 210b reads each of first to fourth sub-frames sFR1 to sFR4 once. However, the scope and spirit of the inventive concept may not be limited thereto. For example, each of the first and second image sensor modules 210a and 210b may continuously read a frame or a sub-frame.

Referring to FIGS. 17 to 19, the first image sensor module 210a may read the first frame FR1 in a rolling shutter manner. The rolling shutter manner may indicate a manner in which rows of a pixel array are sequentially sensed by the row. For example, the first image sensor module 210a may sequentially perform sensing operations with respect to sub-pixels of first to eighth rows R1a to R8a by the row.

The second image sensor module 210b may read the first to fourth sub-frames sFR1 to sFR4, in a sub-frame read method described with reference to FIGS. 1 to 15.

In example embodiments, a length of the first frame FR1 read by the first image sensor module 210a may be the same as that of each of the first to fourth sub-frames sFR1 to sFR4 read by the second image sensor module 210b.

In example embodiments, the resolution of each of the first to fourth sub-frames sFR1 to sFR4 read by the second image sensor module 210b may be a quarter of the resolution of the first frame FR1 read by the first image sensor module 210a.

In example embodiments, the second image sensor module 210b may control a second vertical synchronization signal Vsync2 for reading each of the first to fourth sub-frames sFR1 to sFR4. In example embodiments, since each of the first to fourth sub-frames sFR1 to sFR4 is generated from sub-pixels of which the number is less than that of the first frame FR1, an active section of the vertical synchronization signal Vsync2 for controlling reading of each of the first to fourth sub-frames sFR1 to sFR4 may be shorter than that of the first vertical synchronization signal Vsync1 for reading the first frame FR1.

That is, as illustrated in FIG. 19, the first vertical synchronization signal Vsync1 may be activated during a time from T1 to T7. Data captured from first to eighth rows R1 to R8 may be read during the activation of the first vertical synchronization signal Vsync1. The second vertical synchronization signal Vsync2 may be activated during a time from T1 to T2, a time from T3 to T4, a time from T5 to T6, and a time from T8 to T9. Data for generating each of the first to fourth sub-frames sFR1 to sFR4 may be read out in each section in which the second vertical synchronization signal Vsync2 is activated.

As described above, the second image sensor module 210b may read each of the first to fourth sub-frames sFR1 to sFR4 being an auxiliary frame while the first image sensor module 210a may read the first frame FR1 being the reference frame once. Therefore, an image quality of the user system including the first and second image sensor modules 210a and 210b may be increased, and functions such as high-speed image shooting, HDR, and WDR may be supported. This may mean that the performance of the user system 200 is increased.

Figure 20:
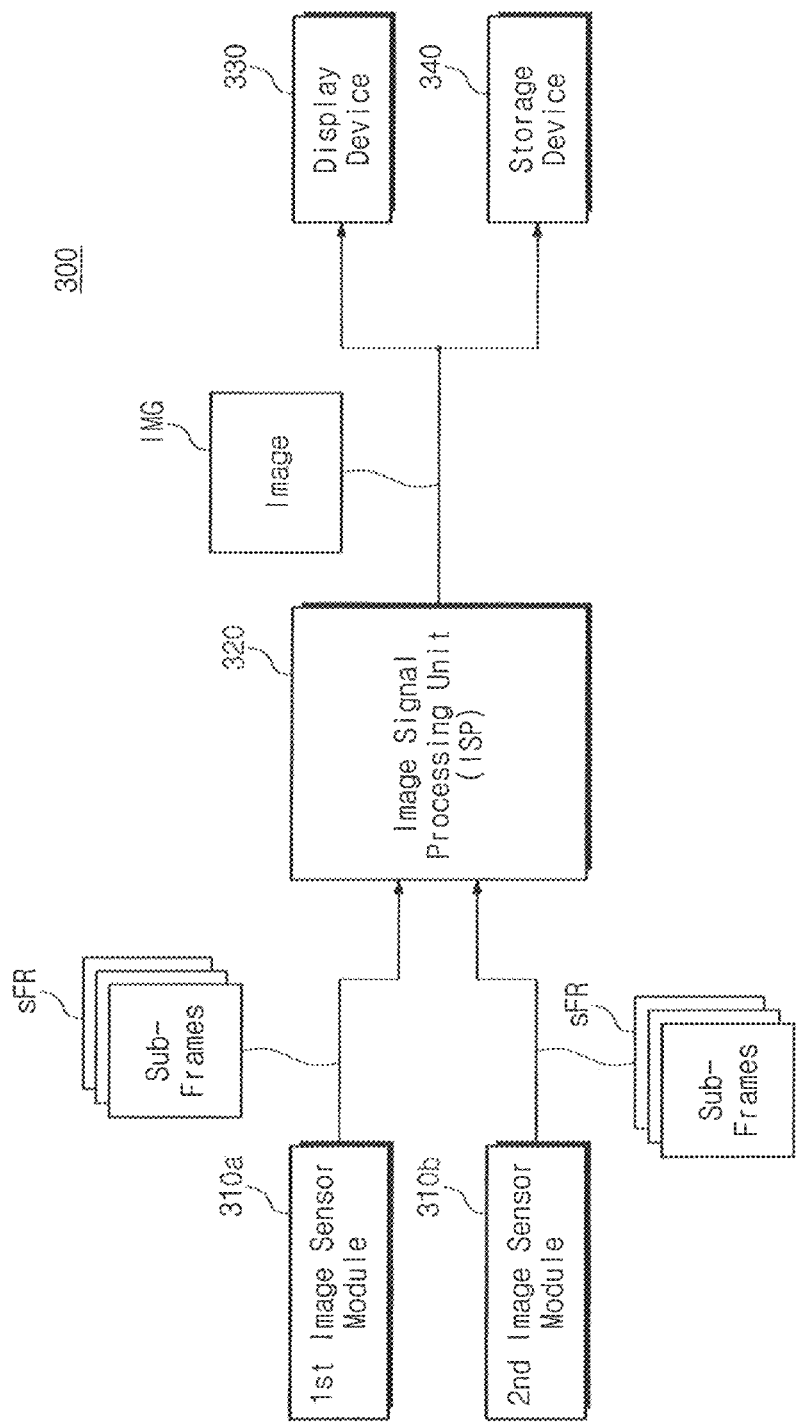
FIG. 20 is a block diagram schematically illustrating according to still another example embodiment of the inventive concept.

FIG. 20 is a block diagram schematically illustrating according to still another example embodiment of the inventive concept. Referring to FIG. 20, a user system 300 may include first and second image sensor modules 310a and 310b, an image signal processing unit 320, a display device 330, and a storage device 340. The image signal processing unit 320, the display device 330, and the storage device 340 are described with reference to FIGS. 1 to 16, and a detailed description thereof is thus omitted.

Unlike the first and second image sensor modules 210a and 210b of FIG. 16, each of the first and second image sensor modules 310a and 310b of FIG. 20 may be an image sensor module described with reference to FIGS. 1 to 15. That is, each of the first and second image sensor modules 310a and 310b may read a plurality of sub-frames based on an operating method described with reference to FIGS. 1 to 15.

The image signal processing unit 320 may generate and output image or photo data based on a plurality of sub-frames sFRs from each of the first and second image sensor modules 310a and 310b.

In example embodiments, each of the first and second image sensor modules 310a and 310b may include a pixel array of which the structure is the same as the pixel array 111 described with reference to FIG. 3.

Figure 21:
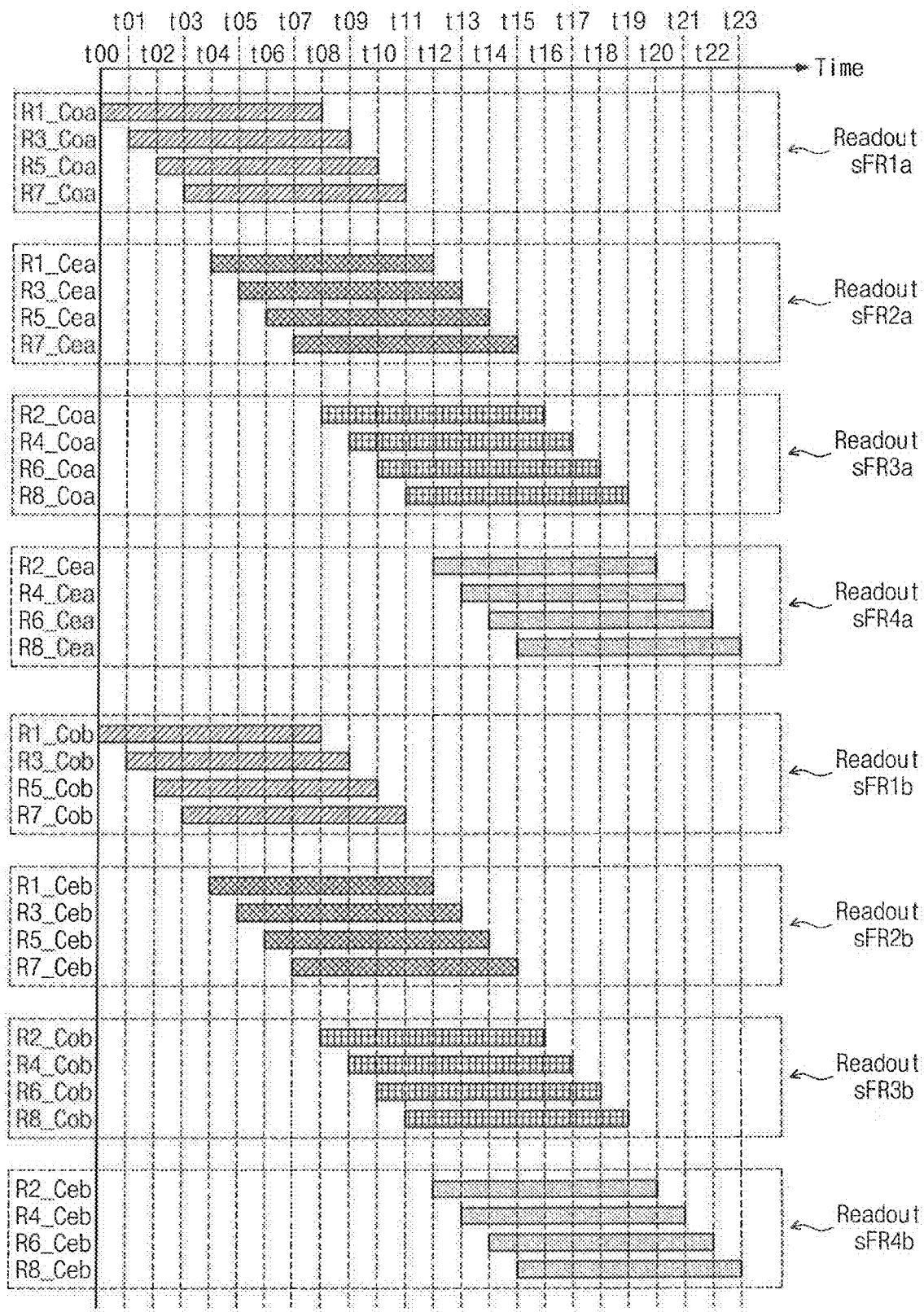
FIGS. 21 and 22 are timing diagrams for describing an operation of first and second image sensor modules of FIG. 20.
Figure 22:
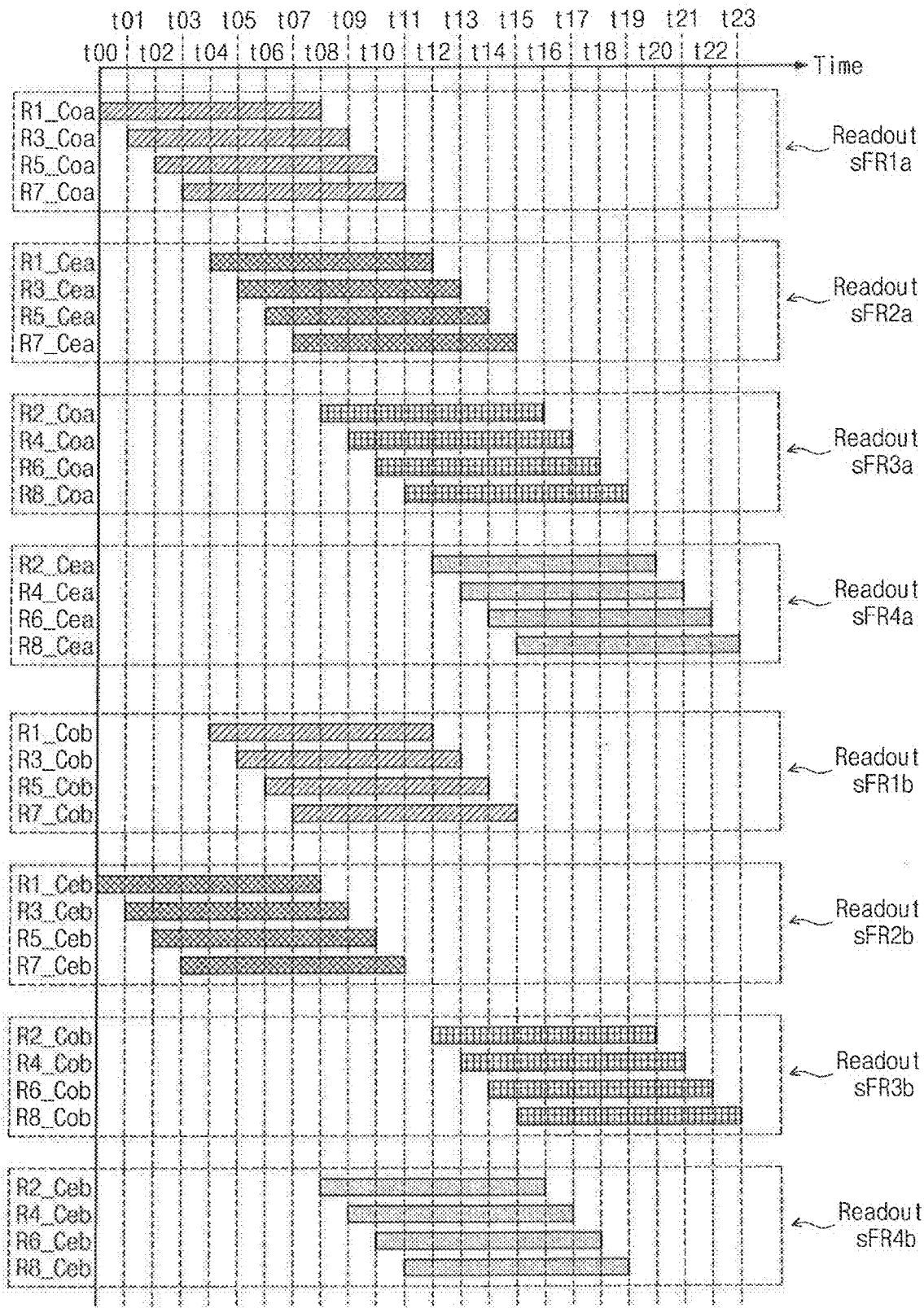

FIGS. 21 and 22 are timing diagrams for describing an operation of first and second image sensor modules of FIG. 20. A detailed description about duplicated configuration and reference numerals may be omitted for descriptive convenience.

For descriptive convenience, it is assumed that sub-sets R1_Coa to R8_Cea are included in the first image sensor module 310a and sub-sets R1_Cob to R8_Ceb are included in the second image sensor module 310b. A reference numeral of each sub-set is similar to that described with reference to FIGS. 6 to 9, and a detailed description thereof is thus omitted. For example, a reference numeral of each sub-set may indicate an odd-numbered sub-set or an even-numbered sub-set of each row of a pixel array that each image sensor module includes.

In example embodiments, a first sub-frame sFR1a of the first image sensor module 310a may be generated based on odd-numbered sub-sets R1_Coa, R3_Coa, R5_Coa, and R7_Coa of first, third, fifth, and seventh rows, a second sub-frame sFR2a thereof may be generated based on even-numbered sub-sets R1_Cea, R3_Cea, R5_Cea, and R7_Cea of the first, third, fifth, and seventh rows, a third sub-frame sFR3a thereof may be generated based on odd-numbered sub-sets R2_Coa, R4_Coa, R6_Coa, and R8_Coa of second, fourth, sixth, and eighth rows, and a fourth sub-frame sFR4a thereof may be generated based on even-numbered sub-sets R2_Cea, R4_Cea, R6_Cea, R8_Cea of the second, fourth, sixth, and eighth rows.

Likewise, a first sub-frame sFR1b of the second image sensor module 310b may be generated based on odd-numbered sub-sets R1_Cob, R3_Cob, R5_Cob, and R7_Cob of the first, third, fifth, and seventh rows, a second sub-frame sFR2b thereof may be generated based on even-numbered sub-sets R1_Ceb, R3_Ceb, R5_Ceb, and R7_Ceb of the first, third, fifth, and seventh rows, a third sub-frame sFR3b thereof may be generated based on odd-numbered sub-sets R2_Cob, R4_Cob, R6_Cob, and R8_Cob of the second, fourth, sixth, and eighth rows, and a fourth sub frame sFR4b thereof may be generated based on even-numbered sub-sets R2_Ceb, R4_Ceb, R6_Ceb, R8_Ceb of the second, fourth, sixth, and eighth rows.

Referring to FIGS. 20 and 21, the first image sensor module 310a may read the first to fourth sub-frames sFR1a to sFR4a from t00 to t23, based on an operating method described with reference to FIG. 10. For example, the first image sensor module 310a may sequentially read the first to fourth sub-frames sFR1a to sFR4a. The first image sensor module 310a may sequentially perform sensing operations with respect to sub-sets of rows in each of the first to fourth sub-frames sFR1a to sFR4a.

Likewise, the second image sensor module 310b may read the first to fourth sub-frames sFR1b to sFR4b from t00 to t23, based on the operating method described with reference to FIG. 10.

A sub-frame read method of the first and second image sensor modules 310a and 310b illustrated in FIG. 20 is in detail described with reference to FIGS. 10 to 15, and a description thereof is thus omitted.

Referring to FIGS. 20 and 22, the first image sensor module 310a may sequentially read the first to fourth sub-frames sFR1a to sFR4a, based on air operating method described with reference to FIG. 10.

The second image sensor module 310b may non-sequentially read the first to fourth sub-frames sFR1b to sFR4b, based on an operating method described with reference to FIG. 11.

A sub-frame read method of the first and second image sensor modules 310a and 310b illustrated in FIG. 21 is described with reference to FIGS. 10 and 11, and a detailed description thereof is thus omitted.

In example embodiments, as illustrated in FIG. 21, each of the first and second image sensor modules 310a and 310b may read a plurality of sub-frames based on the same operating method. Alternatively, as illustrated in FIG. 22, the first and second image sensor modules 310a and 310b may read a plurality of sub-frames based om different operating methods.

Although not illustrated, an operating method of each of the first and second image sensor modules 310a and 310b may be variously changed or modified. For example, the first image sensor module 310a may operate based on a normal operation (i.e., an operation of a rolling shutter manner), operating methods described with reference to FIGS. 10 to 14, or one of combinations thereof. The second image sensor module 310b may operate based on a normal operation (i.e., an operation of a rolling shutter manner), operating methods described with reference to FIGS. 10 to 14, or one of combinations thereof.

Each of the first and second image sensor modules 310a and 310b according to another example embodiment of the inventive concept may read a plurality of sub-frames. Multiple sub-frames read from each of the first and second image sensor modules 310a and 310b may be used to produce a WDR video, thereby increasing the performance of a user system.

Figure 23:
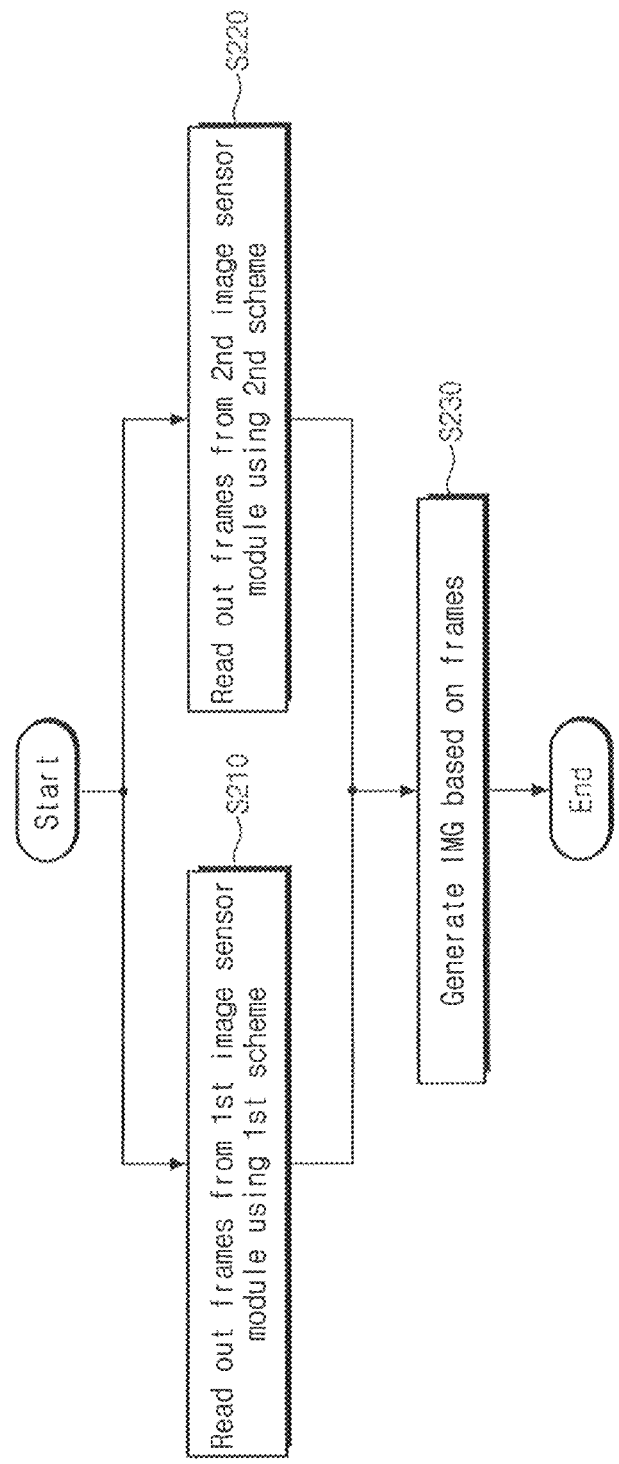
FIG. 23 is a flow chart schematically illustrating an operation of a user system including a dual it cage sensor module.

FIG. 23 is a flow chart schematically illustrating an operation of a user system including a dual image sensor module. An operating method of FIG. 23 will be described with reference to the user system 200 illustrated in FIG. 20. Referring to FIGS. 20 and 23, in step S210, the user system 200 may read frames from the first image sensor module 310a in a first manner. In step S220, the user system 200 may read frames from the second image sensor module 310b in a second manner.

In example embodiments, the first and second manners may mean operating methods for reading a frame or a sub-frame. In example embodiments, the first and second manners may be operating methods described with reference to FIGS. 1 to 22 or one of combinations thereof.

In example embodiments, the first and second manners may be the same operating method. Alternatively, the first and second manners may be different operating methods.

According to example embodiments of the inventive concept, an image sensor module may read a plurality of sub-frames by the sub-set of a row. That is, since a sub-frame is generated by pixels of which the number is less than a general full frame, a read speed between frames or sub-frame may be increased, thereby making it easy to obtain a high-speed image.

Furthermore, a read order of sub-frames or a read order of sub-sets of rows in each sub-frame may be changed, and thus, image noise may be easily removed. In addition, the following frame or sub-frame may be predicted according to a result of computing an error among a plurality of sub-frames, thereby making it easy to correct an error of image data.

In example embodiments, an exposure time between sub-frames or sub-sets of rows may be adjusted, and thus, a HDR or WDR function may be easily implemented.

In a dual image sensor module, a plurality of sub-frames may be used as an auxiliary frame, and thus, noise of a reference frame may be easily removed.

Figure 24:
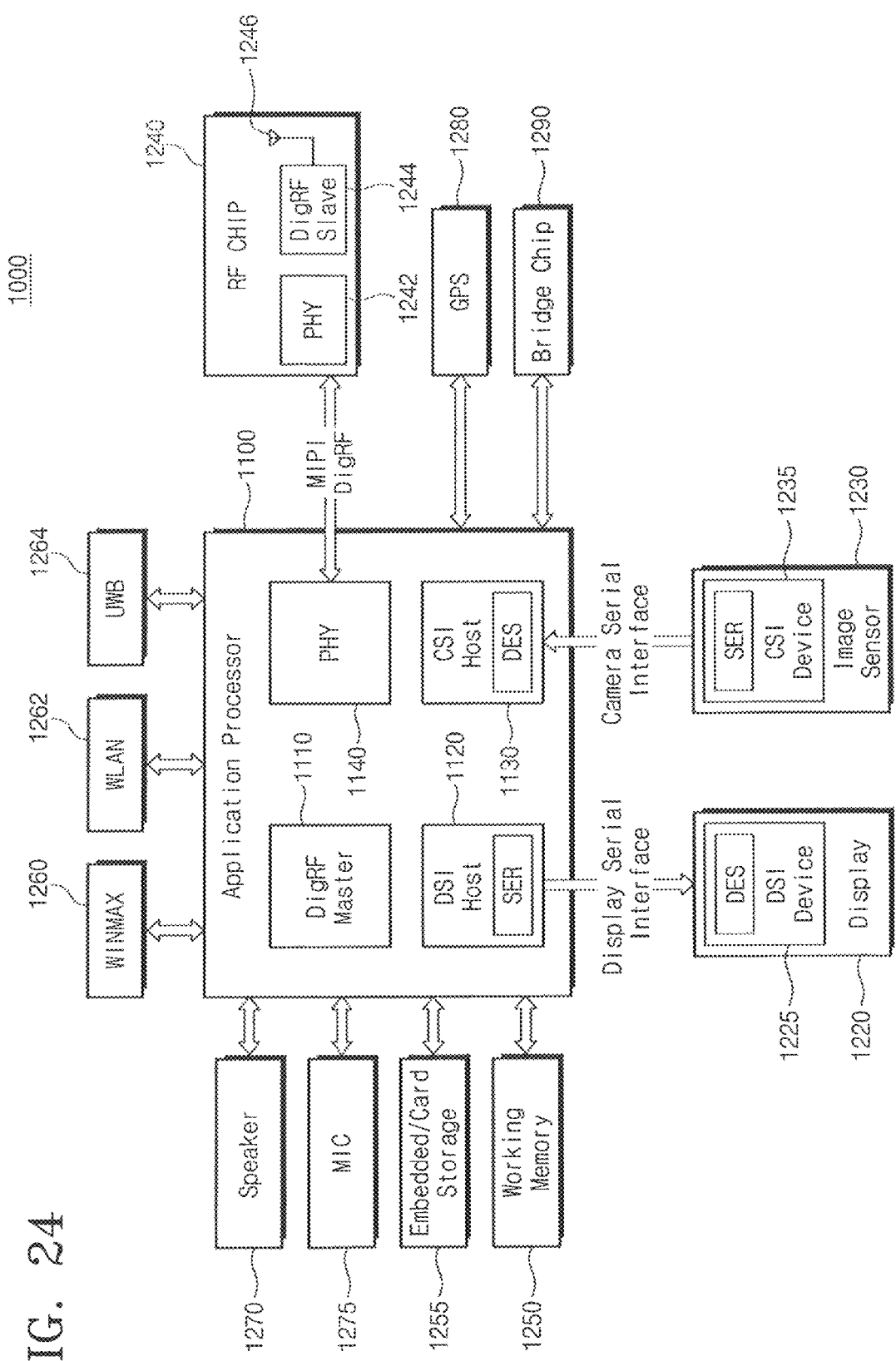
FIG. 24 is a block diagram schematically illustrating an electronic system including an image sensor module according to an embodiment of the inventive concepts.

FIG. 24 is a block diagram schematically illustrating an electronic system including an image sensor module according to an embodiment of the inventive concepts. Referring to FIG. 24, an electronic system 1000 may be implemented with a portable communication terminal, a personal digital assistant (PDA), a portable media player (PMP), a smart phone, or a wearable device.

The electronic system 1000 may include an application processor 1100, a display 1220, and an image sensor module

1230. The application processor 1100 may include a DigRF master 1110, a display serial interface (DSI) host 1120, a camera serial interface (CSI) host 1130, and a physical layer 1140.

The DSI host 1120 may communicate with a DSI device 1225 of the DSI device 1225 based on the DSI. For example, an optical serializer SER may be implemented in the DSI host 1120, and an optical de-serializer DES may be implemented in the DSI device 1225.

The CSI host 1130 may communicate with a CSI device 1235 of the image sensor module 1230 based on the CSI. An optical serializer SER may be implemented in the CSI host 1130, and an optical de-serializer DES may be implemented in the CSI device 1235. In example embodiments, the image sensor module 1230 may be an image sensor module which is described with reference to FIGS. 1 to 23. In example embodiments, the application processor 1100 may further include an image signal processing unit and may process frame or sub-frame data read from the image sensor module 1230.

The electronic system 1000 may further include a radio frequency (RF) chip 1240 capable of communicating with the application processor 1100. The RF chip 1240 may include a physical layer 1242, a DigRF slave 1244, and an antenna 1246. For example, the physical layer 1242 of the RF chip 1240 and a physical layer 1140 of the application processor 1100 may exchange data through a DigRF interface proposed by the MIPI Alliance.

The electronic system 1000 may further include a working memory 1250 and embedded/card storage 1255. The working memory 1250 and the embedded/card storage 1255 may store data provided from the application processor 1100. Also, the working memory 1250 and the embedded/card storage 1255 may provide data stored therein to the application processor 1100.

The working memory 1250 may temporarily store data to be processed or processed by the application processor 1100. The working memory 1250 may include a nonvolatile memory, such as flash memory, PRAM, MRAM, ReRAM, or FRAM, or a volatile memory, such as SRAM, DRAM, or synchronous DRAM (SDRM).

The embedded/card storage 1255 may store data regardless of whether a power is supplied. In example embodiments, the embedded/card storage 1255 may operate in compliance with the UFS interface protocol. However, the spirit and scope of the inventive concept may not be limited thereto.

The electronic system 1000 may communicate with an external system (not illustrated) using the following: Wimax (World Interoperability for Microwave Access) 1260, WLAN (Wireless Local Area Network) 1262, and UWB (Ultra Wideband) 1264.

The electronic system 1000 may further include a speaker 1270 and a microphone 1275 to process voice information. The electronic system 1000 may further include a GPS (Global Positioning System) device 1280 for processing position information. The electronic system 1000 may further include a bridge chip 1290 for managing connection with peripheral devices.

According to an example embodiment of the inventive concept. A plurality of sub-pixels included in a pixel array may be classified by a pixel unit and may be read based on the pixel unit, thereby increasing performance of an image sensor module and reducing noise of a row unit. Furthermore, since a plurality of sub-frames is read with respect to one frame, HDR or WDR may be easily supported, and thus, the performance of the image sensor module may be increased.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An image sensor system comprising:
   a first image sensor including a first pixel array, and configured to generate a full frame using the first pixel array in a rolling shutter manner, the first pixel array including a plurality of first pixels, each of the first pixels including first sub-pixels, sub-pixels in one of the first pixels corresponding to a different color filter from each other;
   a second image sensor including a second pixel array, and configured to generate a plurality of sub-frames using the second pixel array while the first image sensor generates the full frame, the second pixel array including a plurality of second pixels, each of the second pixels including second sub-pixels, sub-pixels in one of the second pixels corresponding to a same color filter with each other; and
   an image signal processing unit configured to perform a signal processing operation on the full frame based on at least one of the plurality of sub-frames to generate a corrected image,
   wherein:
   the second image sensor is configured to generate a first sub-frame of the plurality of sub-frames using a first subset of the second sub-pixels, a second sub-frame of the plurality of sub-frames using a second subset of the second sub-pixels, and a third sub-frame of the plurality of sub-frames using a third subset of the second sub-pixels, and sequentially output the first sub-frame, the second sub-frame, and the third sub-frame.

2. The image sensor system of claim 1, wherein the signal processing operation comprises at least one of a brightness correction, a color correction, a color interpolation, a gamma correction, a color space conversion, and an edge correction.

3. The image sensor system of claim 1, wherein the sub-pixels in one of the second pixels are arranged by N×N, where the N a natural number.

4. The image sensor system of claim 3, wherein the second image sensor is further configured to generate a fourth sub-frame of the plurality of sub-frames using a fourth subset of the second sub-pixels while the first image sensor generates the full frame.

5. The image sensor system of claim 4, wherein four pixels, which are adjacent from each other, of the plurality of second pixels corresponds a first green color filter, a red color filer, a blue color filter, and a second green color filter, respectively.

6. The image sensor system of claim 5, wherein each of the plurality of sub-frames includes color information on a first green color, a red color, a blue color, and a second green color (GRBG).

7. The image sensor system of claim 1, wherein a first time period when the full frame is generated by the first image sensor is longer than a second time period when each of the plurality of sub-frames is generated by the second image sensor.

8. The image sensor system of claim 1, wherein the second image sensor generates each of the plurality of sub-frames by performing a reset operation, an exposure operation, and a readout operation.

9. The image sensor system of claim 8, wherein a first time taken to perform the exposure operation for the first sub-frame is different from a second time taken to perform the exposure operation for the second sub-frame.

10. The image sensor system of claim 8, wherein each of the plurality of sub-frames includes brightness information, and the brightness information of at least two of the plurality of sub-frames is different from each other.

11. The image sensor system of claim 1, wherein a resolution of each of the plurality of sub-frames is smaller than a resolution of the full frame.

12. The image sensor system of claim 1, wherein each of the second sub-pixels comprises:
a photodiode configured to generate charges in response to light passing through a corresponding color filter; and
a transfer transistor configured to be placed between one end of the photodiode and a first node, and operate in response to a transfer signal from a corresponding transfer line among of a plurality of transfer lines.

13. The image sensor system of claim 12, wherein each of the second sub-pixels further comprises:
a reset transistor configured to be placed between the first node and a first voltage, and operate in response to a reset signal from a corresponding reset line among of a plurality of reset lines;
a selection transistor configured to be placed between the first voltage and a second node, and operate in response to a voltage of the first node; and
an access transistor configured to be placed between the second node and a corresponding data line among of a plurality of data lines, and operate in response to a selection signal from a corresponding selection line among of a plurality of selection lines.

14. The image sensor system of claim 13, wherein the second image sensor further comprises:
a row decoder configured to control the plurality of transfer lines, the plurality of reset lines, and the plurality of selection lines; and
an analog-to-digital converter configured to convert analog signals from the plurality of data hens into digital signals, and output the second sub-frames based on the digital signals.

15. An image sensor system comprising:
a first image sensor configured to generate a first set of sub-frames;
a second image sensor configured to generate a second set of sub-frames; and
an image signal processing unit configured to perform a signal processing operation based on at least one of the first set of sub-frames and at least one of the second set of sub-frames to generate a corrected image,
wherein:
the first image sensor includes a first pixel array, the first pixel array including a plurality of first pixels, each of the first pixels including first sub-pixels, sub-pixels in one of the first pixels corresponding to a same color filter with each other,
the first image sensor is further configured to sequentially generate a first sub-frame of the first set using a first subset of the first sub-pixels, a second sub-frame of the first, set using a second subset of the first sub-pixels, and a third sub-frame of the first set using a third subset of the first sub-pixels,
the second image sensor includes a second pixel array, the second pixel array including a plurality of second pixels, each of the second pixels including second sub-pixels, sub-pixels in one of the second pixels corresponding to a same color filter with each other, and
the second image sensor is further configured to non-sequentially generate a first sub-frame of the second set using a first subset of the second sub-pixels, a second sub-frame of the second set using a second subset of the second sub-pixels, and a third sub-frame of the second set using a third subset of the second sub-pixels.

16. The image sensor system of claim 15, wherein
the first subset of the first sub pixels is placed on the first pixel array in a first arrangement,
the second subset of the first sub-pixels is placed on the first pixel array in a second arrangement different from the first arrangement,
the third subset of the first sub-pixels is placed on the first pixel array in a third arrange lent different from the first and second arrangements, and
the first subset of the second sub-pixels is placed on the second pixel array in the first arrangement,
the second subset of the second sub-pixels is placed on the second pixel array in the second arrangement, and
the third subset of the second sub-pixels is placed on the second pixel array in the third arrangement.

17. The image sensor system of claim 16, wherein the first arrangement is defined by odd-numbered rows and odd-numbered columns,
the second arrangement is defined by the odd-numbered rows and even-numbered columns, and
the third arrangement is defined by even-numbered rows and the odd-numbered columns.

18. The image sensor system of claim 15, wherein the signal processing operation comprises at least one of a brightness correction, a color correction, a color interpolation, a gamma correction, a color space conversion, and an edge correction.

19. The image sensor system of claim 15, wherein a resolution of the corrected image is different from each of the first sub-frames and the second sub-frames.

20. The image sensor system of claim 15, wherein each of the first sub-frames and the second sub-frames includes color information on a first green color, a red color, a second green color, and a blue color (GRBG).

* * * * *